(12) United States Patent
Millward

(10) Patent No.: US 8,801,894 B2
(45) Date of Patent: Aug. 12, 2014

(54) SUB-10 NM LINE FEATURES VIA RAPID GRAPHOEPITAXIAL SELF-ASSEMBLY OF AMPHIPHILIC MONOLAYERS

(75) Inventor: Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/723,176

(22) Filed: Mar. 12, 2010

(65) Prior Publication Data

US 2010/0163180 A1  Jul. 1, 2010

Related U.S. Application Data

(62) Division of application No. 11/726,674, filed on Mar. 22, 2007.

(51) Int. Cl.
| | | |
|---|---|---|
| *C23F 1/00* | (2006.01) | |
| *H01L 21/306* | (2006.01) | |
| *B23B 5/00* | (2006.01) | |
| *B23B 7/00* | (2006.01) | |
| *B32B 3/12* | (2006.01) | |
| *B32B 7/00* | (2006.01) | |
| *B82B 1/00* | (2006.01) | |

(52) U.S. Cl.
USPC .......... 156/345.3; 428/98; 428/116; 428/119; 977/700

(58) Field of Classification Search
USPC .......... 156/345.3; 428/98, 116, 119; 977/700
See application file for complete search history.

(56) References Cited

U.S. PATENT DOCUMENTS

| | | | |
|---|---|---|---|
| 4,623,674 A | 11/1986 | Bailey et al. | |
| 4,797,357 A | 1/1989 | Mura et al. | |
| 4,818,713 A * | 4/1989 | Feygenson | 438/372 |
| 4,877,647 A | 10/1989 | Klabunde | |
| 5,328,810 A | 7/1994 | Lowrey et al. | |
| 5,374,367 A | 12/1994 | Edamura et al. | |
| 5,382,373 A | 1/1995 | Carlson et al. | |
| 5,482,656 A | 1/1996 | Hiraoka et al. | |
| 5,512,131 A | 4/1996 | Kumar et al. | |
| 5,538,655 A | 7/1996 | Fauteux et al. | |
| 5,580,700 A | 12/1996 | Rahman | |
| 5,620,850 A | 4/1997 | Bamdad et al. | |
| 5,622,668 A | 4/1997 | Thomas | |
| 5,772,905 A | 6/1998 | Chou | |
| 5,834,583 A | 11/1998 | Hancock et al. | |
| 5,849,810 A | 12/1998 | Muller | |
| 5,879,582 A | 3/1999 | Havelka et al. | |
| 5,879,853 A | 3/1999 | Azuma | |

(Continued)

FOREIGN PATENT DOCUMENTS

| | | |
|---|---|---|
| CN | 1562730 | 1/2005 |
| CN | 1562730 A | 1/2005 |

(Continued)

OTHER PUBLICATIONS

Ali, H.A., et al., Solid-State Electronics 46 (2002), 1639-1642.

(Continued)

*Primary Examiner* — Keath Chen
(74) *Attorney, Agent, or Firm* — TrashBritt

(57) ABSTRACT

Methods for fabricating sub-lithographic, nanoscale microchannels utilizing an aqueous emulsion of an amphiphilic agent and a water-soluble, hydrogel-forming polymer, and films and devices formed from these methods are provided.

26 Claims, 19 Drawing Sheets

(56) References Cited

U.S. PATENT DOCUMENTS

| | | | |
|---|---|---|---|
| 5,891,356 A | 4/1999 | Inoue et al. |
| 5,904,824 A | 5/1999 | Oh |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A * | 11/2000 | Kub et al. ................. 438/459 |
| 6,207,787 B1 | 3/2001 | Fahey et al. |
| 6,251,791 B1 * | 6/2001 | Tsai et al. .................. 438/700 |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 * | 7/2004 | Okoroanyanwu ............ 430/311 |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim et al. |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 * | 10/2007 | Derderian et al. ............ 438/432 |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,080,615 B2 | 12/2011 | Millward |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,114,306 B2 | 2/2012 | Cheng et al. |
| 8,206,601 B2 | 6/2012 | Bosworth et al. |
| 8,287,749 B2 | 10/2012 | Hasegawa et al. |
| 8,294,139 B2 | 10/2012 | Marsh et al. |
| 2001/0024768 A1 | 9/2001 | Matsuo et al. |
| 2001/0049195 A1 * | 12/2001 | Chooi et al. .................. 438/687 |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |

(56) References Cited

U.S. PATENT DOCUMENTS

| | | |
|---|---|---|
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0196748 A1 | 10/2003 | Hougham et al. |
| 2003/0222048 A1 | 12/2003 | Asakawa et al. |
| 2003/0235930 A1 | 12/2003 | Bao et al. |
| 2004/0023287 A1* | 2/2004 | Harnack et al. ............ 435/6 |
| 2004/0028875 A1 | 2/2004 | Van Rijn et al. |
| 2004/0058059 A1 | 3/2004 | Linford et al. |
| 2004/0076757 A1 | 4/2004 | Jacobson et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1* | 12/2004 | Black et al. ............ 257/317 |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze et al. |
| 2005/0159293 A1 | 7/2005 | Wan et al. |
| 2005/0167651 A1 | 8/2005 | Merkulov et al. |
| 2005/0176256 A1* | 8/2005 | Kudelka ............ 438/700 |
| 2005/0208752 A1 | 9/2005 | Colburn et al. |
| 2005/0238889 A1 | 10/2005 | Iwamoto |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee |
| 2006/0046480 A1 | 3/2006 | Guo |
| 2006/0046484 A1* | 3/2006 | Abatchev et al. ......... 438/689 |
| 2006/0060863 A1 | 3/2006 | Lu et al. |
| 2006/0062867 A1 | 3/2006 | Choi |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black |
| 2006/0192283 A1 | 8/2006 | Benson |
| 2006/0205875 A1 | 9/2006 | Cha et al. |
| 2006/0211871 A1 | 9/2006 | Dai et al. |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber |
| 2007/0281220 A1 | 12/2007 | Sandhu et al. |
| 2007/0289943 A1 | 12/2007 | Lu et al. |
| 2007/0293041 A1 | 12/2007 | Yang et al. |
| 2008/0032238 A1 | 2/2008 | Lu et al. |
| 2008/0038467 A1 | 2/2008 | Jagannathan et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0078999 A1 | 4/2008 | Lai |
| 2008/0083991 A1 | 4/2008 | Yang et al. |
| 2008/0085601 A1 | 4/2008 | Park et al. |
| 2008/0093743 A1* | 4/2008 | Yang et al. ............ 257/758 |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |

(56) References Cited

U.S. PATENT DOCUMENTS

| | | |
|---|---|---|
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0204402 A1 | 8/2010 | Millward et al. |
| 2010/0279062 A1 | 11/2010 | Millward |
| 2010/0316849 A1 | 12/2010 | Millward et al. |
| 2010/0323096 A1 | 12/2010 | Sills et al. |
| 2011/0232515 A1 | 9/2011 | Millward |
| 2012/0122292 A1 | 5/2012 | Sandhu et al. |
| 2012/0133017 A1 | 5/2012 | Millward et al. |
| 2012/0135159 A1 | 5/2012 | Xiao et al. |
| 2012/0164389 A1 | 6/2012 | Yang et al. |
| 2012/0211871 A1 | 8/2012 | Russell et al. |
| 2012/0223053 A1 | 9/2012 | Millward et al. |

FOREIGN PATENT DOCUMENTS

| | | | |
|---|---|---|---|
| CN | 1799131 | A | 7/2006 |
| CN | 101013662 | A | 8/2007 |
| EP | 0784543 | B1 | 4/2000 |
| EP | 1416303 | A2 | 5/2004 |
| EP | 1906237 | A2 | 4/2008 |
| EP | 1593164 | B1 | 6/2010 |
| JP | 11-080414 | A | 3/1999 |
| JP | 11080414 | | 3/1999 |
| JP | 2003155365 | A | 5/2003 |
| JP | 2004335962 | A | 11/2004 |
| JP | 2005008882 | A | 1/2005 |
| JP | 2005029779 | A | 2/2005 |
| JP | 2006036923 | | 2/2005 |
| JP | 2006036923 | A | 2/2006 |
| JP | 2006055982 | | 3/2006 |
| JP | 2006055982 | A | 3/2006 |
| JP | 2006110434 | A | 4/2006 |
| JP | 2005008882 | | 7/2006 |
| JP | 2007194175 | A | 8/2007 |
| JP | 2008-036491 | A | 2/2008 |
| KR | 20060128378 | A | 12/2006 |
| KR | 20070029762 | A | 3/2007 |
| KR | 100771886 | B1 | 11/2007 |
| TW | 200633925 | | 10/1994 |
| TW | 200740602 | | 1/1996 |
| TW | 200802421 | | 2/1996 |
| TW | 200400990 | A | 1/2004 |
| TW | 584670 | B | 4/2004 |
| TW | 200419017 | | 10/2004 |
| TW | 200511364 | | 3/2005 |
| TW | 1253456 | | 4/2006 |
| TW | 256110 | | 6/2006 |
| WO | 90/07575 | A1 | 7/1990 |
| WO | 9007575 | | 7/1990 |
| WO | 97/06013 | A1 | 2/1997 |
| WO | 9706013 | | 2/1997 |
| WO | 98/39645 | A1 | 9/1998 |
| WO | 9839645 | A1 | 9/1998 |
| WO | 99/47570 | A1 | 9/1999 |
| WO | 9947570 | | 9/1999 |
| WO | 0031183 | A1 | 6/2000 |
| WO | 0218080 | A1 | 3/2002 |
| WO | 02/081372 | A2 | 10/2002 |
| WO | 02081372 | A2 | 10/2002 |
| WO | 03045840 | A2 | 6/2003 |
| WO | 2005122285 | A2 | 12/2005 |
| WO | 2006003592 | A2 | 1/2006 |
| WO | 2006003594 | A2 | 1/2006 |
| WO | 2006076016 | | 7/2006 |
| WO | 2006076016 | A2 | 7/2006 |
| WO | 2006078952 | | 7/2006 |
| WO | 2006078952 | A1 | 7/2006 |
| WO | 2006112887 | A2 | 10/2006 |
| WO | 2007/001294 | A1 | 1/2007 |
| WO | 2007013889 | A2 | 2/2007 |
| WO | 2007019439 | A2 | 2/2007 |
| WO | 2007019439 | A3 | 2/2007 |
| WO | 2007024241 | | 3/2007 |
| WO | 2007024241 | A2 | 3/2007 |
| WO | 2007024323 | A2 | 3/2007 |
| WO | 2007055041 | | 5/2007 |
| WO | 2007055041 | A1 | 5/2007 |
| WO | 2008055137 | A2 | 5/2008 |
| WO | 2008091741 | A2 | 7/2008 |
| WO | 2008096335 | A2 | 8/2008 |
| WO | 2008097736 | A2 | 8/2008 |
| WO | 2008118635 | A2 | 10/2008 |
| WO | 2008124219 | A2 | 10/2008 |
| WO | 2008130847 | A1 | 10/2008 |
| WO | 2008145268 | A1 | 12/2008 |
| WO | 2008145268 | A2 | 12/2008 |
| WO | 2008156977 | A2 | 12/2008 |
| WO | 2009099924 | A2 | 8/2009 |
| WO | 2009102551 | A2 | 8/2009 |
| WO | 2009117238 | A2 | 9/2009 |
| WO | 2009117243 | A1 | 9/2009 |
| WO | 2009134635 | A2 | 11/2009 |

OTHER PUBLICATIONS

Arshady et al., Makromol. Chem., 1976, vol. 177, p. 2911-2918.

Bae, Joonwon, Surface Modification Using Photo-Crosslinkable Random Copolymers, Abstract submitted for the Mar. 2006 meeting of The American Physical Society, submitted Nov. 30, 2005.

Balsara et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bang, J., Abstract submitted for the Mar. 6 meeting of the American Physical Society, submitted Nov. 2005 (online), accessed via the Internet (retrieved on Apr. 5, 2010), URL: <http://absimage.aps.org/image/MWS_MAR06-2005-003641.pdf>.

Bang, Joona, The Effect of Humidity on the Ordering of Tri-block Copolymer Thin Films, Abstract submitted for the Mar. 2007 meeting of The American Physical Society, submitted Nov. 20, 2006.

Bass, Robert B., et al., Microcontact Printing with Octadecanethiol, Applied Surface Science, 226(4), pp. 335-340, Apr. 2004, http://www.ece.virginia.edu/UVML/sis/Papers/rbbpapers/assoct.pdf.

Bearinger, J.P., et al., Nature Materials 2, 259-264, 2003.

Berry, B.C., et al., Effects of Zone Annealing on Thin Films of Block Copolymers, National Institute of Standard and Technology, Polymers Division, Gaithersburg, MD., 2007.

Black, C.T., IEEE 2005 Custom Integrated Circuits Conference, pp. 87-91.

Black, C.T., Applied Physics Letters 87, 163116-1 to 1163116-3, 2005.

Black, C.T., et al., IBM J. Res. & Dev., vol. 51, No. 5, Sep. 2007, pp. 605-633.

Black, C.T., Proc. of SPIE, vol. 6153, 615302 (2006).

Black, Charles T., IEEE Transactions on Nanotechnology, vol. 3, No. 3, Sep. 2004, pp. 412-415.

Black, Charles T., ACSNano, vol. 1, No. 3, 2007, American Chemical Society, pp. 147-150.

Black, Charles T., et al., IEEE Electronon Device Letters, vol. 25, No. 9, Sep. 2004, pp. 622-624.

Botelho do Rego, A.M., et al., Surface Science, 482-485 (2001), pp. 1228-1234.

Brydson, Rik M., et al. (chapter authors), Generic Methodologies for Nanotechnology: Classification and Fabrication, Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).

Bulpitt, Paul et al, Journal of Biomedical Materials Research, vol. 47, Issue 2, pp. 152-169, Abstract only.

Canaria, Christi A., et al., Formation and Removal of Alkylthiolate Self-Assembled Monolayers on Gold in Aqueous Solutions, Lab Chip 6, 289-295 (2006), http://www.rsc.org/publishing/journals/LC/article.asp?doi=b51066c] (Abstract).

(56) References Cited

OTHER PUBLICATIONS

Candau et al., Polymer, 1977, vol. 18, p. 1253-1257.
Cavicchi, Kevin A., et al., Macromolecules 2007, vol. 40, 2007, pp. 1181-1186.
Chandekar, Amol, et al., Template-Directed Adsorption of block Copolymers on Alkanethiol-Patterned Gold Surfaces, (circa 2006), http://www.nano.neu.edu/industry/industry_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Cheng, Joy Y., et al., Nano Letters, vol. 6, No. 9, 2006, pp. 2009-2103.
Cheng, Joy Y., et al., Adv. Mater. 2003, vol. 15, No. 19, pp. 1599-1602.
Cheng, Joy Y., et al., Applied Physics Letters, 91, 143106-143106-3 (2007).
Daoulas Kostas Ch., et al., Physical Review Letters 96, week ending Jan. 27, 2006, pp. 036104-1-3.
Darling, S.B., Progress in Polymer Science, vol. 32, No. 10, Sep. 28, 2007, pp. 1152-1204.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Elisseeff J., et al., Journal of Biomedical Materials Research, 51(2): 164-171, Aug. 2000, Abstract only.
Fasolka, Michael J. et al., Macromolecules 2000, vol. 33, No. 15, pp. 5702-5712.
Gates, Byron D., et al., Annu. Rev. Mater. Res. 2004, 34:339-72.
Ge, Zhenbin, et al., PRL 96, 186101-1 186101-4, The American Physical Society, week ending May 12, 2006.
Gelest Inc., Silane Coupling Agents: Connecting Across Boundaries, pp. 1-56, 2006.
Genua, A., et al., Nanotechnology, 18 (2007), pp. 1-7.
Gillmor, S.D., et al., Langmuir 2000, vol. 16, No. 18, 2000, pp. 7223-7228.
Gudipati, Chakravarthy S., et al., Journal of Polymer Science Part A: Polymer Chemistry, vol. 42, pp. 6193-6208, Oct. 2004.
Guo, Kai, et al., Abstract of Synthesis and Characterization of Novel Biodegradable Unsaturated Poly(ester amide)/ Poly(ethylene glycol) Diacrylate Hydrogels, Journal of Polymer Science Part A: Polymer Chemistry, vol. 43, Issue 17, pp. 3932-3944, 2005 Wiley Periodicals, Inc.
Hamley, I. W., Introduction to Block Copolymers, Developments in Block Copolymers Science and Technology, 2004, John Wiley & Sons, Ltd., pp. 1-29.
Harrison, Christopher et al., Polymer, vol. 39, No. 13, pp. 2733-2744, 1998.
Hawker, et al., Facile Synthesis of Block Copolymers for Nanolithographic Applications; Polymer Reprints, 2005.
He, Yiyong et al., J. Am. Chem. Soc. 2006, 128, 2745-2750.
Hermans, Thomas M., et al., Application of Solvent-Directed Assembly of Block Copolymers to the Synthesis of Nanostructured Materials with Low Dielectric Constants, Angewandte Chem. Int. Ed. 2006, 45, pp. 6648-6652.
Hutchison, J. Brian, et al., Chem. Mater., vol. 17, No. 19, 2005, pp. 4789-4797.
In, Insik, et al., Langmuir, vol. 22, No. 18, 2006, pp. 7855-7860.
Ji, Shengxiang, et al., Preparation of Neutral Wetting Brushes for Block Copolymer Films from Homopolymer Blends, submitted to Advanced Materials, 20[16]: 3054-3060; published online Jul. 7, 2008.
Ji, Shengxiang, et al., Macromolecules, 2008, 41(23): 9098-9103.
Ruiz, Ricardo, et al., Adv. Mater, 2007, 19, pp. 587-591.
Ruiz, Ricardo et al., Science, vol. 321, Aug. 15, 2008, pp. 936-939.
Ryu, Du Yeol, et al., Macromolecules, vol. 40, No. 12, 2007, pp. 4296-4300.
Saraf, Ravi R., et al., Applied Physics Letters, vol. 80, No. 23, Jun. 10, 2002, pp. 4425-4427.
Sawhney, Amarpreet S., et al., Macromolecules 1993, 26, 581-587, Abstract only.
Segalman, Rachel A., Materials Science and Engineering R 48 (2005), pp. 191-226.
Shahrjerdi, Davood, et al., IEEE Electron Device Letters, vol. 28, No. 9, Sep. 2007, pp. 793-796.
Sharma, Sadhana, et al., Applied Surface Science, 206 [2003], pp. 218-229.
Sivaniah, E., et al., Macromolecules 2003, 36, pp. 5894-5896.
Sivaniah, et al., Macromolecules 2005, 38, 1837-1849.
Solak, Harun H., Journal of Physics D: Applied Physics, 2006, pp. R171-R188.
Srinvivasan, Charan, et al., ACS Nano, vol. 1, No. 3, pp. 191-201, 2007.
Stoykovich, Mark P., et al., Science, vol. 308, Jun. 3, 2005, pp. 1442-1446.
Stoykovich, Mark P., et al., ACS Nano, vol. 1, No. 3, 2007, pp. 168-175.
Sundrani, Deepak, et al., Nano Lett., vol. 4, No. 2, 2004, pp. 273-276.
Sundrani, Deepak, et al., Langmuir 2004, vol. 20, No. 12, 2004, pp. 5091-5099.
Truskett, Van N., et al., Trends in Biotechnology, vol. 24, No. 7, Jul. 2006, pp. 312-315.
Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Wang, C., et al., Electrochimica Acta 52 (2006), pp. 704-709.
Wathier, Michel, et al., J. Am. Chem. Soc., 2004, 126 (40), pp. 12744-12745, Abstract only.
Winesett, D.A., et al., Langmuir 2003, 19, pp. 8526-8535.
Xiao, Shuaigang et al., Nanotechnology 16 (2005) S324-S329.
Xu, Ting et al., Polymer 42, [2001] 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582.
Yang, XiaoMin, et al., J. Vac. Sci. Technol. B 22[6], Nov./Dec. 2004, 3331-3334.
Yurt, Serkan, et al., Macromolecules 2006, vol. 39, No. 5, 2006.
Zhang, Mingfu, et al., Adv. Mater. 2007, 19, pp. 1571-1576.
Berry et al., Nano Letters vol. 7, No. 9, Aug. 2007, p. 2789-2794.
Fukunaga et al., Macromolecules vol. 39, Aug. 2006, p. 6171-6179.
Hammond et al., Macromoleculars vol. 38, Jul. 2005, p. 6575-6585.
Knoll et al., "Phase Behavior in Thin Films of Cylinder-Forming Block Copolymers", Physical Review Letters, vol. 89, No. 3, Jul. 2002.
Zehner, et al., Langmuir, vol. 14, No. 2, pp. 241-244, Jan. 20, 1998.
Jun, et al., Langmuir, 2002, 18(9), pp. 3415-3417, Abstract only.
Karim, Alamgir et al., Control of Ordering Kinetics and Morphology Using Zone Annealing of Thin Block Copolymer Filmes, Abstract submitted for the Mar. 2007 Meeting of The American Physical Society, Nov. 20, 2006.
Kim, IS, et al., Int J Pharm., Sep. 15, 2000; 205(1-2): 109-16, Abstract only.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Adv. Mater. 2004, 16, No. 3, Feb. 3, pp. 226-231.
Kim, Seung Hyun, et al., Macromolecules 2006, vol. 39, No. 24, 2006, pp. 8473-8479.
Kim, Seung Hyun, et al., Advanced Mater., vol. 16, No. 23-24, pp. 2119-2123, Dec. 17, 2004.
Kim, SH, J Biomater Appl., Jul. 2000; 15(1): 23-46 Abstract only.
Kim, SH, J Biomater Res., Mar. 15, 2000; 49(4): 517-27 Abstract only.

(56) References Cited

OTHER PUBLICATIONS

Kim, Su-Jin, et al., J. Vac. Sci. Technol. B26(1), Jan./Feb. 2008, 189-194.
Krishnamoorthy, Sivashankar, et al., MaterialsToday, vol. 9, No. 9, Sep. 2006, pp. 40-47.
La, Young-Hye, et al., Chem. Mater, 2007, vol. 19, No. 18, pp. 4538-4544.
La, Young-Hye, et al., J. Vac. Sci. Technol. B 25[6], Nov./Dec. 2007, pp. 2508-2513.
Laracuente, A.R., et al., Surface Science 545, 2003, pp. 70-84.
Lentz, David, et al., Whole Wafer Imprint Patterning Using Step and Flash Imprint Lithography: A Manufacturing Solution for Sub 100 nm Patterning , SPIE Advanced Lithography Paper, http://molecularimprints. com/ NewsEvents/tech_articles/new_articles/SPIE_07_MII_WW_Paper.pdf], Feb. 2007, pp. 1-10.
Li, Mingqi, et al., MaterialsToday, vol. 9, No. 9, Sep. 2006, pp. 30-39.
Li, Wai-kin, et al, J. Vac. Sci. Technol. B 25[6], Nov./Dec. 2007, pp. 1982-1984.
Li, Xue, et al., ScienceDirect, Polymer 48 [2007], pp. 2434-2443.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902.
Lutolf, M.P., et al, Nature Biotechnology, 23, 47-55 (2005), Abstract only.
Malkoch, Michael, et al., Chem. Commun., 2006, pp. 2774-2776.
Mansky, P., et al., Science, vol. 275, Mar. 7, 1997, pp. 1458-1460.
Martens, P., et al., Polymer, vol. 41, Issue 21, Oct. 2000, pp. 7715-7722, Abstract only.
Matsuda, T., et al., Asaio J, Jul.-Sep. 1992; 38(3): M154-7, Abstract only.
Maye, Mathew A., et al., Journal of Chemical Education, vol. 79, No. 2, Feb. 2002, pp. 207-210.
Metters, Andrew, et al., Biomacromolecules 2005, 6, pp. 290-301, 2005.
Meyer, Evelyn, et al., Macromollecular Mater. Eng., 276/277, 2000, pp. 44-50.
Mezzenga, Raffaele, et al., Langmuir 2003, vol. 19, No. 20, 2003, pp. 8144-8147.
Mindel, Joseph., et.al., A Study of Bredig Platinum Sols , The Chemical Laboratories of New York University, vol. 65 pp. 2112.
Nealey, Paul F., et al., Self-Assembling Resists for Nanolithography , IEEE 2005.
Naito, et al., IEEE Transactions on Magnetics, vol. 38, No. 5, Sep. 2002, pp. 1949-1951.
Nguyen, Kytai, et al., Biomaterials 23, 2002, pp. 4307-4314.
Nishikubo, T., American Chemical Society Symposium Series, 1997, p. 214-230.
Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).
Olayo-Valles, Roberto et al., J. Mater. Chem, 2004, 14, 2729-2731.
Parejo, Pilar Garcia, et al., J. Mater. Chem., 2006, 16, pp. 2165-2169.
Park, Cheolmin, et al., Polymer 44, 2003, 6725-6760.
Park, Dae-Ho, Nanotechnology 18, 2007, 355304, pp. 1-7.
Park, Miri, et al., Science, v. 276, No. 5317, p. 1401-1404, May 30, 1997.
Park, Sang-Min, et al., Adv. Mater., 2007, 19, pp. 607-611.
Park, Sung Chan, et al., Macromolecules 2007, vol. 40, No. 22, pp. 8119-8124.
Peng, Juan et al., Macromol. Rapid Commun. 2007, 28, 1422-1428.
Peters, Richard D., et al., J. Vac. Sci. Technol. B, vol. 18, No. 6, Nov./Dec. 2000, pp. 3530-3532.
Peters, Richard D., et al., Macromolecules, vol. 35, No. 5, 2002, pp. 1822-1834.
Potemkin, Igor I., et al., Macromol. Rapid Commun., 2007, 28, pp. 579-584.
Resnick, Douglas, J., et al., J. Microlith., Microfab., Microsyst., vol. 3, No. 2, Apr. 2004, pp. 316-321.
Rogers, John A., ACS Nano, vol. 1, No. 3, pp. 151-153, 2007.
Rozkiewicz, Dorota I., et al., Angew. Chem. Int. Ed., 2006, 45, pp. 5292-5296.
Park, Seung Hak, et al., Soft Matter, 2010, 6, 2010, 120-125.
Wipf, Handbook of Reagents for Organic Synthesis, 2005, John Wiley & Sons Ltd., p. 320.
Cha, Jennifer N., et al., Chem. Mater. 2007, 19, 839-843.
Chang, Li-Wen, Proc. Of Spie, vol. 6156, 2006, 615611-1 to 615611-6.
Chang, Li-Wen, IEEE International Electron Devices Meeting (IEDM), paper 33.2, Dec. 6-8, San Francisco, 2010, pp. 33.2.1-33.2.4.
Yamaguchi, Toru, et al., Microprocesses and Nanotechnology, 2007, Conference date Nov. 5-8, 2007, pp. 434-435.
Zhang, Yuan et al., Applied Physics Letter, 91, 013104, 2007, pp. 013104 to 013104-3.
Ikeda, Susumu et al., NanotechJapan Bulletin—vol. 3, No. 3, Dec. 17, 2010/Focus 26-06.
Search Report of the IPO, Taiwanese Application No. 097110156, issued Apr. 10, 2012, one (1) page with one (1) page translation.
Search Report of Taiwanese Patent Application No. 097121922, dated Oct. 16, 2011, 1 page.
Search Report of Taiwanese Patent Application No. 098108789, dated Dec. 18, 2012, 1 page.
Search Report of Taiwanese Patent Application No. 098109253, dated Aug. 22, 2012, 1 page.
Choi et al., "Magnetorheology of Synthesized Core—Shell Structured Nanoparticle," IEEE Transactions on Magnetics, vol. 41, No. 10, Oct. 2005, pp. 3448-3450.
Hawker et al, Abstract for "Improving the Manufacturability and Structural Control of Block Copolymer Lithography," Abstracts of Papers, 232nd ACS National Meeting, San Francisco, CA, Sep. 10-14, 2006.
Helmbold & Meissner, "Optical Absorption of Amorphous Hydrogenated Carbon Thin Films," Thin Solid Films, vol. 283, Issue 1-2, 1996, pp. 196-203.
Lutolf et al., "Cell-Responsive Synthetic Hydrogels," Adv. Mater., vol. 15, No. 11, Jun. 2003, pp. 888-892.
Truskett & Watts, "Trends in Imprint Lithography for Biological Applications," Trends in Biotechnology, vol. 24, No. 7, Jul. 2006, pp. 312-315.
Zhu et al., "Molecular Assemblies on Silicon Surfaces via Si-O Linkages," Langmuir, vol. 16, No. 17, Jul. 2000, pp. 6766-6772.
Ji et al., "Molecular Transfer Printing Using Block Copolymers," ACS Nano, vol. 4, No. 2, 2010, pp. 599-609.
Asakawa et al., Fabrication of Subwavelength Structure for Improvement in Light-Extraction Efficiency of Light-Emitting Devices Using a Self-Assembled Pattern of Block Copolymer, Applied Optics, vol. 44, No. 34, (Dec. 1, 2005), pp. 7475-7482.
Black et al., Integration of Self-Assembled Diblock Copolymers for Semiconductor Capacitor Fabrication, Applied Physics Letters, vol. 79, No. 3, (2001), pp. 409-411.
Brydson et al. (chapter authors), Generic Methodologies for Nanotechnology: Classification and Fabrication, Nanoscale Science and Technology, John Wiley & Sons, Ltd., (Dec. 20, 2005) (available at http://www3.interscience.wiley.com/cgi-bin/summary/112217550/SUMMARY), pp. 1-55.
Chai et al, Assembly of Aligned Linear Metallic Patterns on Silicon, Nature Nanotechnology, vol. 2, (Aug. 2007), pp. 500-506.
Chai et al., Using Cylindrical Domains of Block Copolymers to Self-Assemble and Align Metallic Nanowires, American Chemical Society, www.acsnano.org, (2008), pp. A-M.
Chen et al., Highly Ordered Arrays of Mesoporous Silica Nanorods with Tunable Aspect Ratios from Block Copolymer Thin Films, Advanced Materials, vol. 20, (2008), pp. 763-767.
Cho et al., Nanoporous Block Copolymer Micelle/Micelle Multilayer Films with Dual Optical Properties, J. Am. Chem. Soc., vol. 128, No. 30, (2006), pp. 9935-9942.
Clark et al., Selective Deposition in Multilayer Assembly: SAMs as Molecular Templates, Supramolecular Science, vol. 4, (1997), pp. 141-146.
Erlandsson et al., Metallic Zinc Reduction of Disulfide Bonds Between Cysteine Residues in Peptides and Proteins, Int'l J. Peptide Res. & Therapeutics, vol. 11, No. 4, (Dec. 2005), pp. 261-265.

(56) References Cited

OTHER PUBLICATIONS

Fasolka et al., Block Copolymer Thin Films: Physics and Applications, Annu. Rev. Mater. Res., vol. 31, (Aug. 2001), pp. 323-355.
Gates, Nanofabrication with Molds & Stamps, Materials Today, (Feb. 2005), pp. 44-49.
Grubbs, Hybrid Metal-Polymer Composites from Functional Block Copolymers, J. Of Polymer Sci.: Part A: Polymer Chemistry, vol. 43, Issue 19, (Oct. 1, 2005), pp. 4323-4336.
Guarini et al., Nanoscale Patterning Using Self-Assembled Polymers for Semiconductor Applications, J. Vac. Sci. Technol. B 19(6), (Nov./Dec. 2001), pp. 2784-2788.
Hadziioannou, Semiconducting Block Copolymers for Self-Assembled Photovoltaic Devices, MRS Bulletin, (Jun. 2002), pp. 456-460.
Hamers, Passivation and Activation: How Do Monovalent Atoms Modify the Reactivity of Silicon Surfaces? A Perspective on the Article, "The Mechanism of Amine Formation on Si(100) Activated with Chlorine Atoms," by C.C. Fustad, A.D. Thorsness, and A.J. Muscat, Surface Sci., vol. 600, (2006), pp. 3361-3362.
Hayward et al., Crosslinked Poly(styrene)-block-Poly(2-vinylpyridine) Thin Films as Swellable Templates for Mesostructured Silica and Titania, Advanced Materials, vol. 17, (2005), pp. 2591-2595.
Helmuth et al., High-Speed Microcontact Printing, J. Am. Chem. Soc., vol. 128, No. 29, (2006), pp. 9296-9297.
Horiuchi et al., Three-Dimensional Nanoscale Alignment of Metal Nanoparticles Using Block Copolymer Films as Nanoreactors, Langmuir, vol. 19, (2003), pp. 2963-2973.
Huang et al., Stretchable Gold Conductors on Elastomeric Substrates, Applied Physics Letters, vol. 82, No. 15, (Apr. 14, 2003), pp. 2404-2406.
Huang et al., Using Surface Active Random Copolymers to Control the Domain Orientation in Diblock Copolymer Thin Films, Macromolecules, vol. 31, (1998), pp. 7641-7650.
Hur et al., Nanotransfer Printing by Use of Noncovalent Surface Forces: Applications to Thin-Film Transistors That Use Single-Walled Carbon Nanotube Networks and Semiconducting Polymers, Applied Physics Letters, vol. 85, No. 23, (Dec. 6, 2004), pp. 5730-5732.
Jiang et al., Electrochemical Desorption of Self-Assembled Monolayers Noninvasively Releases Patterned Cells from Geometrical Confinements, J. Am. Chem. Soc., vol. 125, No. 9, (2003), pp. 2366-2367.
Johnson et al., Probing the Stability of the Disulfide Radical Intermediate of Thioredoxin Using Direct Electrochemistry, Letters in Peptide Sci., vol. 10, (2003), pp. 495-500.
Jun et al., Patterning Protein Molecules on Poly(ethylene glycol) Coated Si(111), Biomaterials, vol. 25, (2004), pp. 3503-3509.
Kavakli et al., Single and Double-Layer Antireflection Coatings on Silicon, Turk J. Phys., vol. 26, (2002), pp. 349-354.
Knoll et al., Phase Behavior in Thin Films of Cylinder-Forming Block Copolymers, Physical Review Letters, vol. 89, No. 3, (Jul. 15, 2002), The American Physical Society, pp. 035501-1 to 035501-4.
Krishnamoorthy et al., Block Copolymer Micelles as Switchable Templates for Nanofabrication, Languir, vol. 22, No. 8, (2006), pp. 3450-3452.
Krishnamoorthy et al., Nanopatterned Self-Assembled Monolayers by Using Diblock Copolymer Micelles as Nanometer-Scale Adsorption and Etch Masks, Advanced Materials, (2008), pp. 1-4.
Kuhnline et al., Detecting Thiols in a Microchip Device Using Micromolded Carbon Ink Electrodes Modified with Cobalt Phthalocyanine, Analyst, vol. 131, (2006), pp. 202-207.
Li et al., A Method for Patterning Multiple Types of Cells by Using Electrochemical Desorption of Self-Assembled Monolayers within Microfluidic Channels, Angew. Chem. Int. Ed., vol. 46, (2007), pp. 1094-1096.
Liu et al., Pattern Transfer Using Poly(styrene-block-methyl methacrylate) Copolymer Films and Reactive Ion Etching, J. Vac. Sci. Technol. B, vol. 25, No. 6, (Nov./Dec. 2007), pp. 1963-1968.
Loo et al., Additive, Nanoscale Patterning of Metal Films with a Stamp and a Surface Chemistry Mediated Transfer Process: Applications in Plastic Electronics, Applied Physics Letters, vol. 81, No. 3, (Jul. 15, 2002), pp. 562-564.
Lopes et al., Hierarchical Self-Assembly of Metal Nanostructures on Diblock Copolymer Scaffolds, Nature, vol. 414, (Dec. 13, 2001), pp. 735-738.
Lutz, 1,3-Dipolar Cycloadditions of Azides and Alkynes: a Universal Ligation Tool in Polymer and Materials Science, Angew. Chem. Int. Ed., vol. 46, (2007), pp. 1018-1025.
Malenfant et al., Self-Assembly of an Organic-Inorganic Block Copolymer for Nano-Ordered Ceramics, Nature Nanotechnology, vol. 2, (Jan. 2007), pp. 43-46.
Niu et al., Selective Assembly of Nanoparticles on Block Copolymer by Surface Modification, Nanotechnology, vol. 18, (2007), pp. 1-4.
Park et al., Fabrication of Highly Ordered Silicon Oxide Dots and Stripes from Block Copolymer Thin Films, Advanced Materials, vol. 20, (2008), pp. 681-685.
Park et al., High-Aspect-Ratio Cylindrical Nanopore Arrays and Their Use for Templating Titania Nanoposts, Advanced Materials, vol. 20, (2008), pp. 738-742.
Reed et al, Molecular Random Access Memory Cell, Appl. Phys. Lett., vol. 78, No. 23, (Jun. 4, 2001), pp. 3735-3737.
Sang et al., Epitaxial Self-Assembly of Block Copolymers on Lithographically Defined Nanopatterned Substrates, Nature, vol. 24, (Jul. 24, 2003), pp. 411-414.
Sato et al., Novel Antireflective Layer Using Polysilane for Deep Ultraviolet Lithography, J. Vac. Sci. Technol. B, vol. 17, No. 6, (Nov./Dec. 1999), pp. 3398-3401.
Sohn et al., Fabrication of the Multilayered Nanostructure of Alternating Polymers and Gold Nanoparticles with Thin Films of Self-Assembling Diblock Copolymers, Chem. Mater., vol. 13, (2001), pp. 1752-1757.
Tadd et al, Spatial Distribution of Cobalt Nanoclusters in Block Copolymers, Langmuir, vol. 18, (2002), pp. 2378-2384.
Tang et al., Evolution of Block Copolymer Lithography to Highly Ordered Square Arrays, Science, vol. 322, No. 5900, (Sep. 25, 2008), pp. 429-432.
Trimbach et al., Block Copolymer Thermoplastic Elastomers for Microcontact Printing, Langmuir, vol. 19, (2003), pp. 10957-10961.
Tseng et al., Enhanced Block Copolymer Lithography Using Sequential Infiltration Synthesis, J. of Physical Chemistry, (Jul. 11, 2011), 16 pgs.
Xia et al., An Approach to Lithographically Defined Self-Assembled Nanoparticle Films, Advanced Materials, vol. 18, (2006), pp. 930-933.
Xia et al., Soft Lithography, Annu. Rev. Mater. Sci., vol. 28, (1998), pp. 153-184.
Xu et al., Electric Field Alignment of Symmetric Diblock Copolymer Thin Films, Macromolecules, (2003), 5 pgs.
Xu et al., Interfacial Interaction Dependence of Microdomain Orientation in Diblock Copolymer Thin Films, Macromolecules, vol. 38, (2005), pp. 2802-2805.
Xu et al., Surface-Initiated Atom Transfer Radical Polymerization from Halogen-Terminated Si(111) (Si—X, X=Cl, Br) Surfaces for the Preparation of Well-Defined Polymer-Si Hybrids, Langmuir, vol. 21, No. 8 (2005), pp. 3221-3225.
Yang et al., Covalently Attached Graft Polymer Monolayer on Organic Polymeric Substrate via Confined Surface Inhibition Reaction, J. Polymer Sci.-A-Polymer Chemistry Ed., vol. 45, Issue 5, (2007), pp. 745-755.
Yu et al., Contact Printing Beyond Surface Roughness: Liquid Supramolecular Nanostamping, Advanced Materials, vol. 19, (2007), pp. 4338-4342.
Zaumseil et al., Three-Dimensional and Multilayer Nanostructures Formed by Nanotransfer Printing, Nano Letters, vol. 3, No. 9, (2003) pp. 1223-1227.
Zhang et al., Self-Assembled Monolayers of Terminal Alkynes on Gold, J. Am. Chem. Soc., vol. 129, No. 16, (2007), pp. 4876-4877.

(56) References Cited

OTHER PUBLICATIONS

Zhao et al., Colloidal Subwavelength Nanostructures for Antireflection Optical Coatings, Optics Letters, vol. 30, No. 14, (Jul. 15, 2005), pp. 1885-1887.

Zhou et al., Nanoscale Metal/Self-Assembled Monolayer/Metal Heterostructures, Appl. Phys. Lett., vol. 71, No. 5, (Aug. 4, 1997), pp. 611-613.

Zhu et al., Grafting of High-Density Poly(Ethylene Glycol) Monolayers on Si(111), Langmuir, vol. 17, (2001), pp. 7798-7803.

Fujita et al., Thin Silica Film with a Network Structure as Prepared by Surface Sol-Gel Transcription on the Poly(styrene-b-4-vinylpyridine) Polymer Film, Chemistry Letters, vol. 32, No. 4, (Dec. 31, 2003), pp. 352-353.

Melde et al, Silica Nanostructures Templated by Oriented Block Copolymer Thin Films Using Pore-Filling and Selective-Mineralization Routes, Chem. Mater., vol. 17, No. 18, (Aug. 13, 2005), pp. 4743-4749.

"Electronegativity," <http://www.princeton.edu/~achaney/tmve/wiki100k/docs/Electronegativity.html> website, visited Aug. 28, 2013, 1 page.

International Preliminary Report on Patentability for International Application No. PCT/US2008/056584, dated Sep. 22, 2009, 7 pages.

International Search Report and Written Opinion of the International Searching Authority for PCT/US2008/056584, dated Dec. 3, 2008, 10 pages.

* cited by examiner

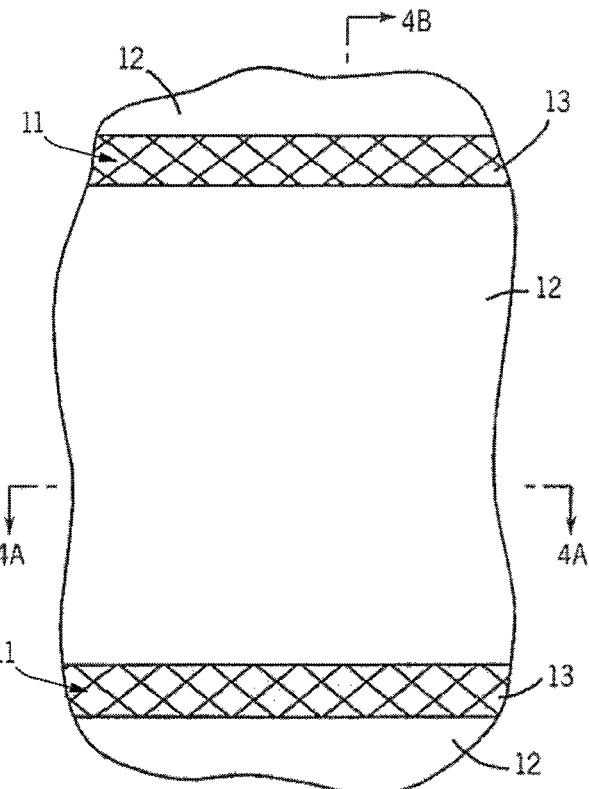
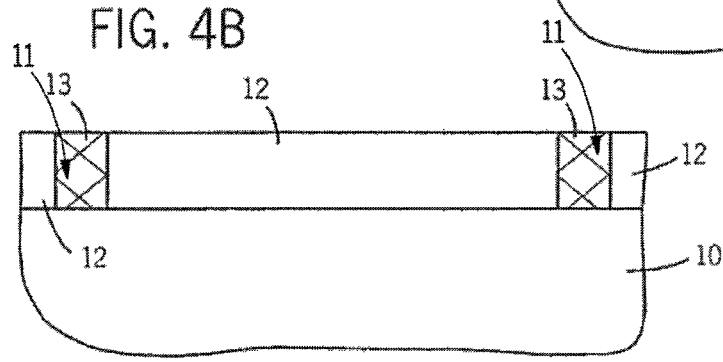
FIG. 4
FIG. 4A
FIG. 4B

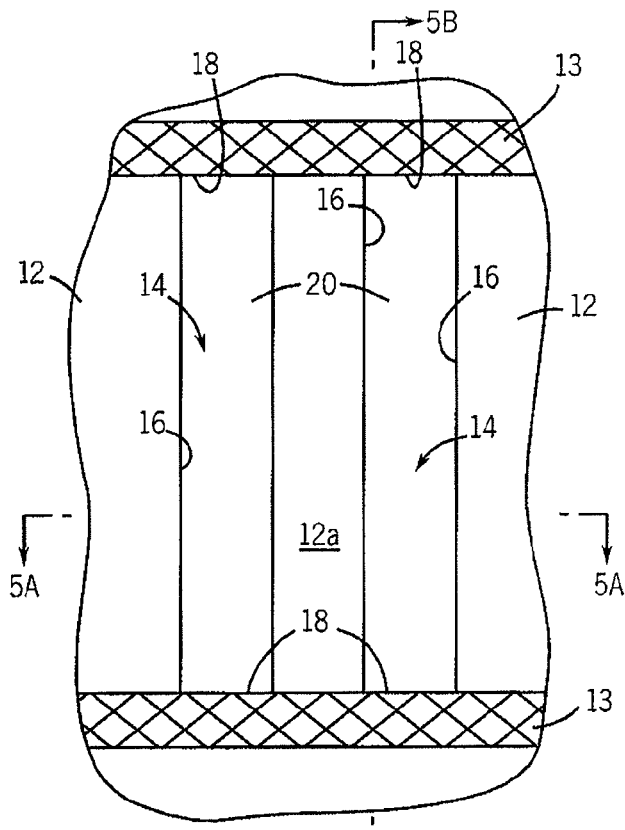
FIG. 5
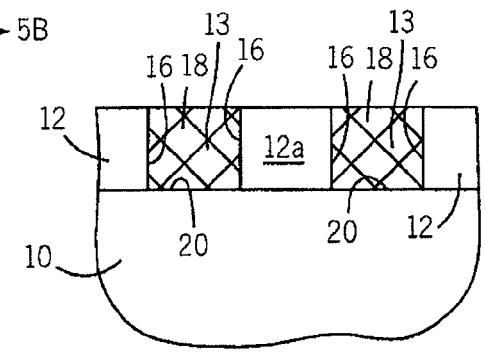
FIG. 5A
FIG. 5B
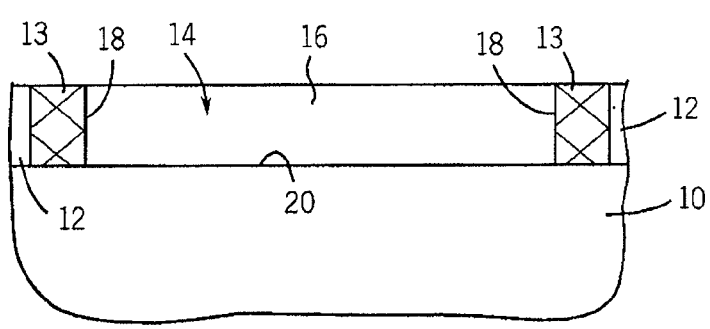

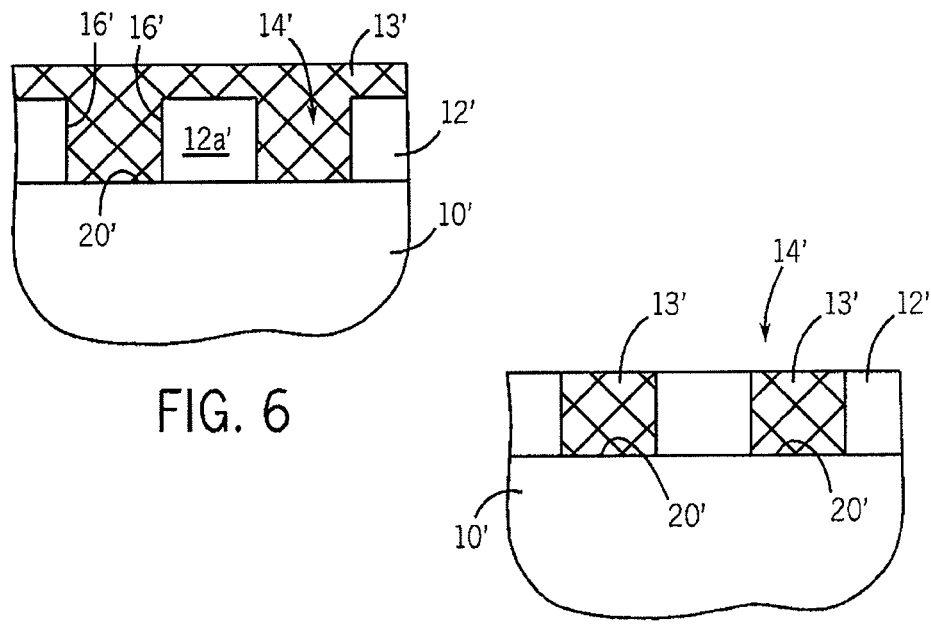
FIG. 6
FIG. 7A
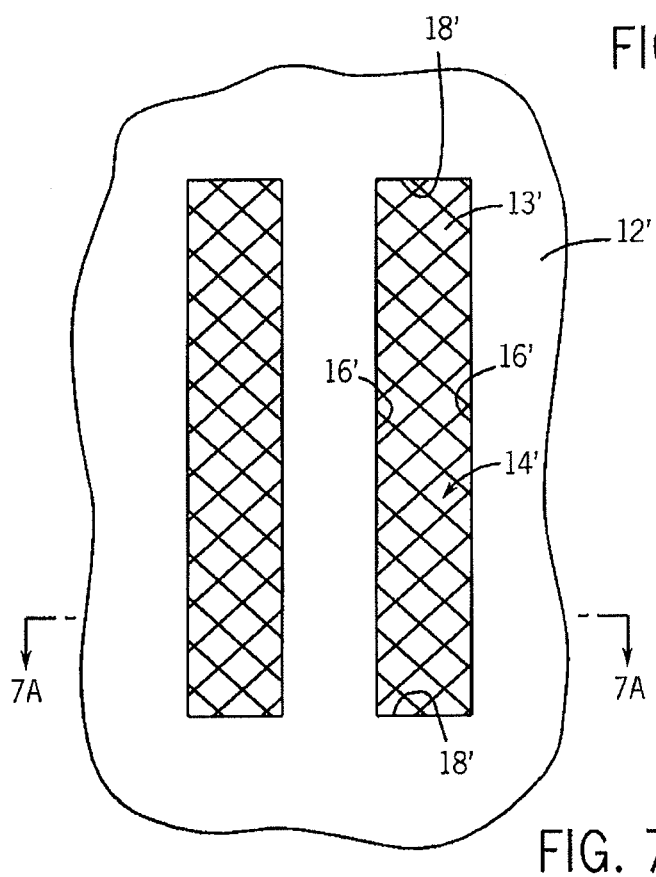
FIG. 7

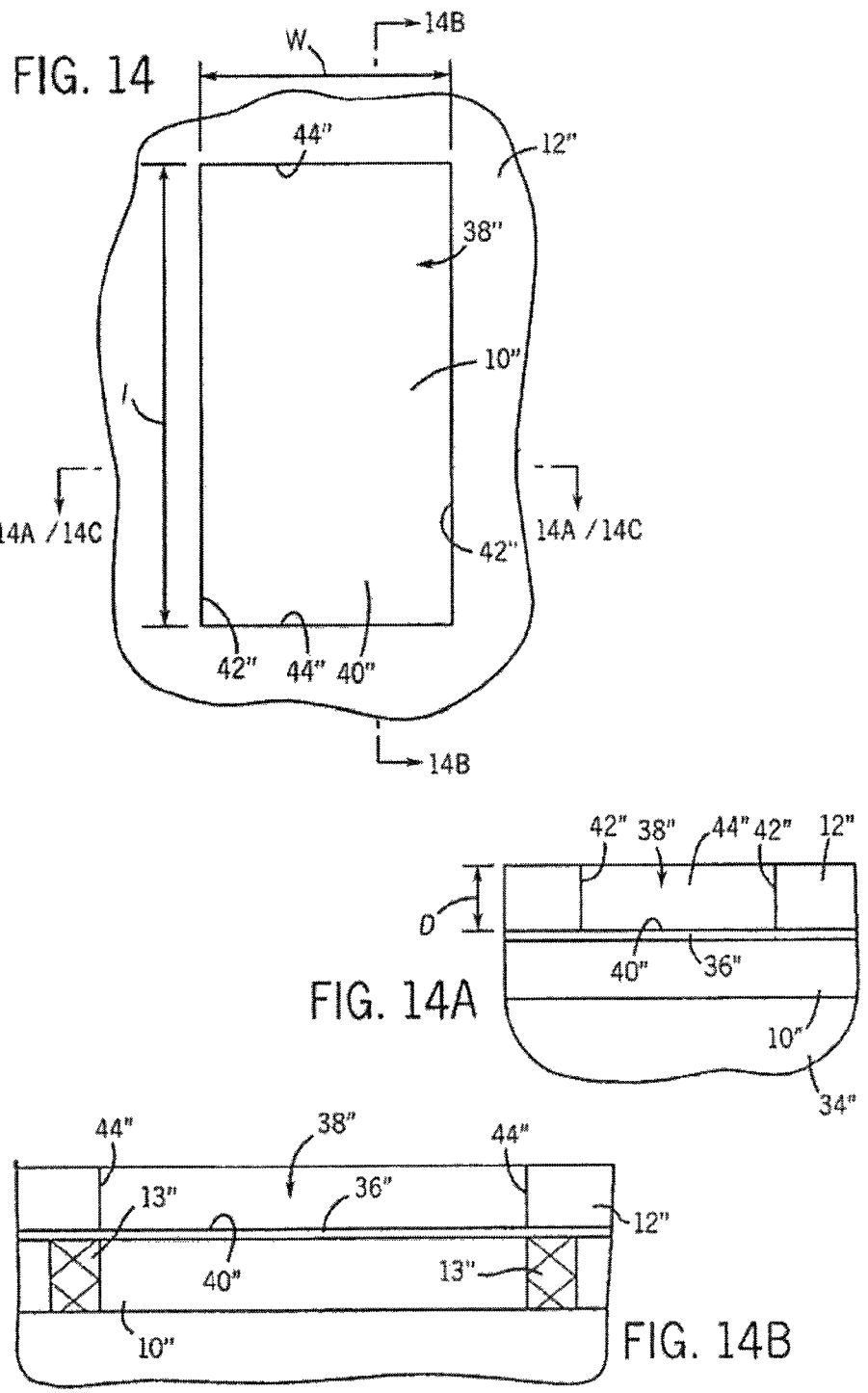

US 8,801,894 B2

SUB-10 NM LINE FEATURES VIA RAPID GRAPHOEPITAXIAL SELF-ASSEMBLY OF AMPHIPHILIC MONOLAYERS

CROSS-REFERENCE TO RELATED APPLICATION

This application is a divisional of U.S. patent application Ser. No. 11/726,674, filed Mar. 22, 2007, now U.S. Pat. No. 8,557,128, issued Oct. 15, 2013.

TECHNICAL FIELD

Embodiments of the invention relate to nanofabrication techniques and, more particularly, to methods for preparing nanoscale microstructures and microchannels and to devices resulting from those methods.

BACKGROUND OF THE INVENTION

As the development of nanoscale mechanical, electrical, chemical, and biological devices and systems increases, new processes and materials are needed to fabricate such devices and components. Optical lithographic processing methods are not able to accommodate fabrication of structures and features at the nanometer level. The use of self-assembling diblock copolymers presents another route to patterning at nanometer dimensions. Diblock copolymer films spontaneously assemble into periodic structures by microphase separation of the constituent polymer blocks after annealing, for example, by thermal annealing above the glass transition temperature of the polymer or by solvent annealing, forming ordered domains at nanometer-scale dimensions. Following self assembly, one block of the copolymer can be selectively removed and the remaining patterned film used as an etch mask for patterning nanosized features into an underlying substrate. Since the domain sizes and periods ($L_o$) involved in this method are determined by the chain length of a block copolymer (MW), resolution can exceed other techniques, such as conventional photolithography, while the cost of the technique is far less than electron beam (e-beam) lithography or extreme ultraviolet (EUV) photolithography, which have comparable resolution.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into a periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Recently, graphoepitaxy, which involves the use of lithographical-defined topographical features to direct block copolymer assembly, has been used in forming registered, self-assembled diblock copolymer structures.

Although diblock copolymers are receiving attention for the ability to self-assemble and form sub-lithographic ordered features, there are inherent limitations in the use of these materials including an approximate minimal feature size of 10 nm and relatively slow rates of formation of ordered structures on the order of hours.

It would be useful to provide a method of fabricating nanoscale microstructures and microchannels that overcome these problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 2-5 illustrate diagrammatic top plan views of a portion of a substrate at various stages of processing according to an embodiment of the present disclosure to provide hydrophilic trench ends. FIGS. 2A-5A and 2B-5B illustrate elevational, cross-sectional views of the substrate shown in FIGS. 2-5 taken along lines 2A-2A to 5A-5A and lines 2B-2B to 5B-5B, respectively.

FIG. 6 illustrates an elevational, cross-sectional view of a portion of the substrate depicted in FIGS. 1 and 1A at a subsequent processing step according to another embodiment of the disclosure to provide hydrophilic trench ends.

FIGS. 7 and 8 illustrate diagrammatic top plan views of the substrate shown in FIG. 6 in subsequent processing steps. FIGS. 7A and 8A are elevational, cross-sectional views of the substrate shown in FIGS. 7 and 8 taken along lines 7A-7A and 8A-8A, respectively.

FIG. 14 is a diagrammatic top plan view of the substrate shown in FIG. 13 at a subsequent processing stage. FIGS. 14A and 14B are elevational, cross-sectional views of the substrate shown in FIG. 14, taken along lines 14A-14A and 14B-14B, respectively.

FIGS. 16 and 17 and 16B and 17B are elevational, cross-sectional views of the substrate shown in FIGS. 16 and 17 taken, respectively, along line 16-16A, line 17A-17A, line 16B-16B, and line 17B-17B.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including, but not limited to, bulk semiconductive materials such as a semiconductor wafer (either alone or in assemblies comprising other materials thereon) and semiconductive material layers (either alone or in assemblies comprising other materials). The term "substrate" refers to any supporting structure, including, but not limited to, the semiconductive substrates, wafer fragments, or wafers described above.

"$L_o$" is the inherent pitch (bulk period or repeat unit) of structures that self assemble upon annealing from a self-assembling (SA) block copolymer or a blend of a block copolymer with one or more of its constituent homopolymers.

"Hydrogels" are cross-linked soluble polymers that swell because of an affinity for water but do not dissolve in water due to structural and/or chemical crosslinks.

The methods overcome limitations of fabricating films from self-assembling block copolymers. In embodiments of the invention, the methods utilize a trench template defined either lithographically or by use of a film template formed by the graphoepitaxial self-assembly of a lamellar block copolymer inside a wider trench and selective removal of one of the assembled blocks to form films that can be utilized, for example, in etching sub-10 nm features in a substrate.

Steps in a method for fabricating nanoscale microstructures and microchannels according to an embodiment of the invention are illustrated in FIGS. 1-12.

Figure 1:
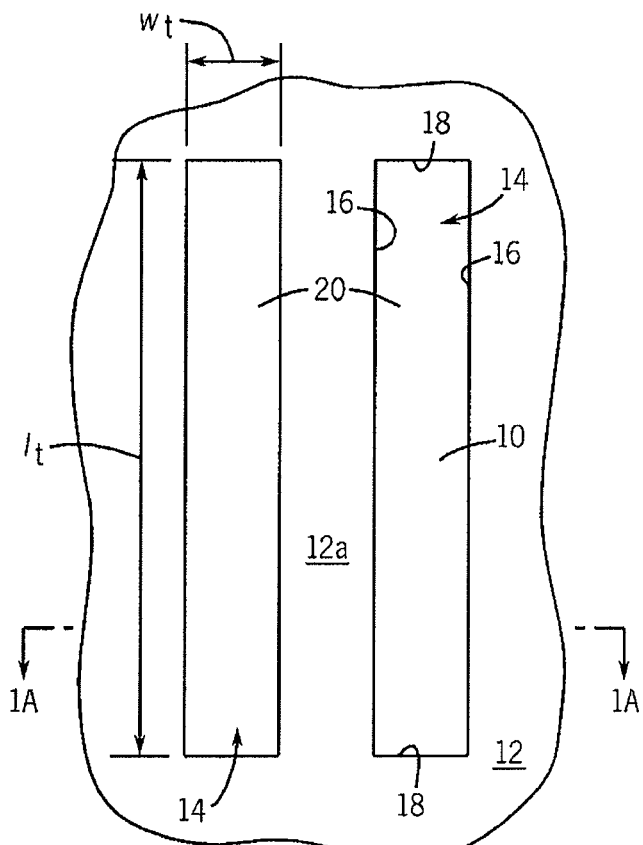
FIG. 1 illustrates a diagrammatic top plan view of a portion of a substrate at a preliminary processing stage according to some embodiments of the present disclosure, showing the substrate with trenches.
Figure 1A:
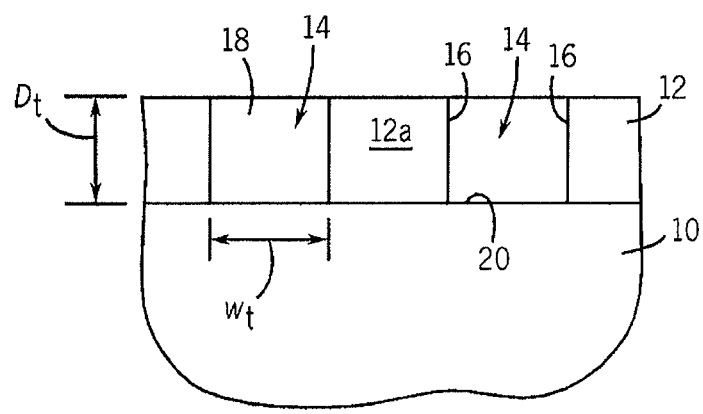
FIG. 1A is an elevational, cross-sectional view of the substrate depicted in FIG. 1 taken along line 1A-1A.

Referring to FIGS. 1 and 1A, a substrate 10 with an overlying material layer 12 is shown. In the described embodiment, the material layer 12 is patterned to form trenches 14. The trenches 14 can be formed using a lithographic technique such as photolithography, extreme ultraviolet (EUV) lithography, proximity X-rays, electron beam (e-beam) lithography, as known and used in the art. Conventional photolithography can provide trenches 14 with widths down to about 60 nm. E-beam and EUV lithography can produce smaller features, although at a slower rate and higher expense.

A method called "pitch doubling" or "pitch multiplication" can also be used for extending the capabilities of photolithographic techniques beyond their minimum pitch, as described, for example, in U.S. Pat. No. 5,328,810 (Lowrey et al.), U.S. Patent Publication No. 2006/0281266 (Wells), now U.S. Pat. No. 7,396,781, issued Jul. 8, 2008, and U.S. Patent Publication No. 2007/0023805 (Wells et al.), now U.S. Pat. No. 7,776,715, issued Aug. 17, 2010, the disclosures of which are incorporated by reference herein. Briefly, a pattern of lines is photolithographically formed in a photoresist layer overlying a layer of an expendable material, which in turn overlies a substrate. The expendable material layer is etched to form placeholders or mandrels. The photoresist is stripped. Spacers are formed on the sides of the mandrels, and the mandrels are then removed, leaving behind the spacers as a mask for patterning the substrate. Thus, where the initial photolithography formed a pattern defining one feature and one space, the same width now defines two features and two spaces, with the spaces defined by the spacers. As a result, the smallest feature size possible with a photolithographic technique is effectively decreased down to about 30 nm or more.

In some embodiments, trenches or grooves with widths in the about 10 to 30 nm range can be defined using techniques involving graphoepitaxial self-assembly of lamellar-phase block copolymers to provide an etch mask for patterning underlying substrate stacks, e.g., silicon over silicon oxide, as described with reference to FIGS. 13-19.

As illustrated in FIGS. 1 and 1A, each trench 14 is structured with opposing sidewalls 16, opposing ends 18 (which may also be referred to herein as edges), a floor 20 (which may also be referred to herein as a bottom surface), a width ($w_t$), a length ($l_t$), and a depth ($D_t$). In some embodiments, the trench dimension is about 20-200 nm wide ($w_t$) and about 1600-2400 nm in length ($l_t$), with a depth ($D_t$) of about 50-500 nm. Substrate 10 is exposed as the floor 20 of the trench 14, and a portion of the material layer 12 forms a spacer interval or crest 12a between the trenches 14. The trenches 14 are structured such that the sidewalls 16 are hydrophobic and preferential wetting to the surfactant component of the described polymer/surfactant emulsion, and the floor 20 of the trench 14 is hydrophilic such that the polymer component will assemble within the center of the trench 14.

In some embodiments, the substrate 10 is composed of an oxide layer, e.g., silicon oxide ($SiO_x$), and the material layer 12 is a silicon layer (with native oxide). Hydrophobic trench sidewalls 16 and ends 18 can be provided by removing the native oxide from the surface of a silicon material layer 12 within the trenches 14 to form hydrogen-terminated silicon. H-terminated silicon can be prepared by a conventional process, for example, by a fluoride ion etch of silicon (with native oxide present), for example, by immersion in an aqueous solution of hydrogen fluoride (HF) or buffered HF and/or ammonium fluoride ($NH_4F$), by HF vapor treatment, by exposure to hot $H_2$ vapor, or by a hydrogen plasma treatment (e.g., atomic hydrogen).

In other embodiments, including embodiments in which the surfactant material layer (e.g., surfactant monolayer 24) (FIGS. 9-11A) is removed by a wet extraction process (FIGS. 12 and 12A), the material layer 12 can be composed of a carbonaceous film such as amorphous carbon, which is semi-graphitic but not crystalline in nature, to provide hydrophobic trench sidewalls 16 and ends 18. In some embodiments, the amorphous carbon can be a form of transparent carbon that is highly transparent to light. Deposition techniques for forming a highly transparent carbon can be found in A. Helmbold & D. Meissner, *Optical Absorption of Amorphous Hydrogenated Carbon Thin Films*, 283(1-2) THIN SOLID FILMS 196-203 (1996), the disclosure of which is incorporated herein by reference. In addition, amorphous carbon layers can be formed by chemical vapor deposition using a hydrocarbon compound, or mixtures of such compounds, as carbon precursors such as ethylene, propylene, toluene, propyne, propane, butane, butylene, butadiene, and acetylene. A suitable method for forming amorphous carbon layers is described in U.S. Pat. No. 6,573,030 (Fairbairn et al.), the entire disclosure of which is incorporated herein by reference.

The trench floors 20 (e.g., of silicon oxide, which is inherently hydrophilic) can then be treated to provide a selectively graftable surface. In some embodiments, a ligand (anchor, linker) having a reactive moiety (e.g., an end group) can be grafted onto the surface of the oxide layer of the substrate 10 (with the reactive moiety oriented toward the center of the trench 14). For example, in embodiments using a Click-based chemistry reaction for the formation of a hydrogel composed of PEO or PEG, an example of a useful linker or ligand is poly(ethylene glycol) (PEG) functionalized with an alkyne, group, as described, for example, in Michael Malkoch et al., *Synthesis of Well-Defined Hydrogel Networks Using Click Chemistry*, CHEM. COMMC'NS 2774-76 (2006), the disclosure of which is incorporated herein by reference. As described in Malkoch et al., PEG can be reacted with excess anhydride (e.g., 4-pentynoic anhydride) to derivatize both ends of the PEG moiety with alkyne groups. To provide a derivatized PEG ligand having a reactive end group that can be grafted onto the surface of an oxide layer, PEG can be reacted with an anhydride in an about 1:1 ratio to derivatize one end of the PEG moiety with an alkyne group and the other end with a hydroxyl group. The mono-hydroxylated PEG ligands can then be grafted to an oxide (e.g., $SiO_2$) surface by spin-coating (e.g., from a 1% w/v solution in toluene) and heating to allow the terminal OH groups to diffuse to and react with the oxide layer, as described, for example, in P. Mansky et al., *Controlling Polymer-Surface Interactions with Random Copolymer Brushes*, 275 (5305) SCIENCE 1458-60 (1997), the disclosure of which is incorporated by reference herein. The PEG group of the attached ligand provides a linker to the PEG or PEO moieties from the hydrogel emulsion. Non-grafted material can be removed by rinsing with an appropriate solvent (e.g., toluene).

In another embodiment, an alkyne-functionalized PEG ligand containing a silane group such as trichlorosilane or trialkoxysilane can be grafted to an oxide surface. For example, a mono-hydroxylated PEG ligand can be reacted with tetrachlorosilane ($SiCl_4$) or tetraethoxysilane $Si(OC_2H_5)_4$ to produce the desired compound, which can be applied to the trench floors 20, for example, by spin-on application. Conditions for the application of trialkoxy and trichlorosilane compounds are described, for example, by Barry Arkles, *Silane Coupling Agents: Connecting Across Boundaries* (v2.0), Gelest, Inc., Morrisville, Pa. (2006), the disclosure of which is incorporated herein.

In other embodiments using a free radical polymerization process for the preparation of the hydrogel, an example of a suitable linker is PEG polymer functionalized with an acrylate group at one end such as a PEG acrylate, or PEG methacrylate, which can be obtained from a commercial source such as Sigma-Aldrich Co. (St. Louis, Mo.).

Figure 9:
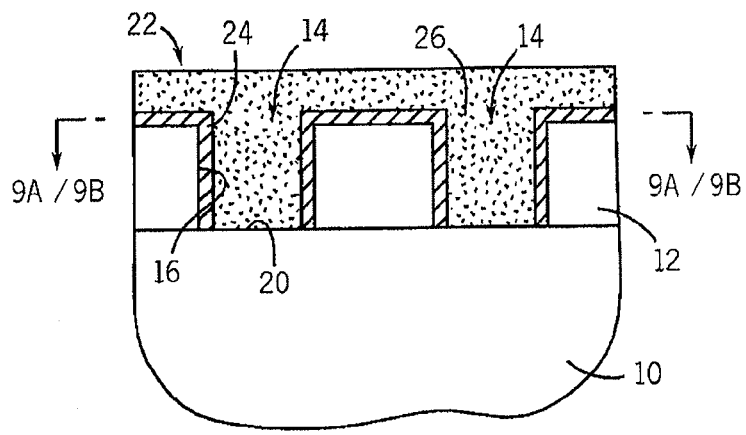
FIG. 9 is an elevational, cross-sectional view of the substrates shown in FIGS. 9A and 9B.
Figure 9A:
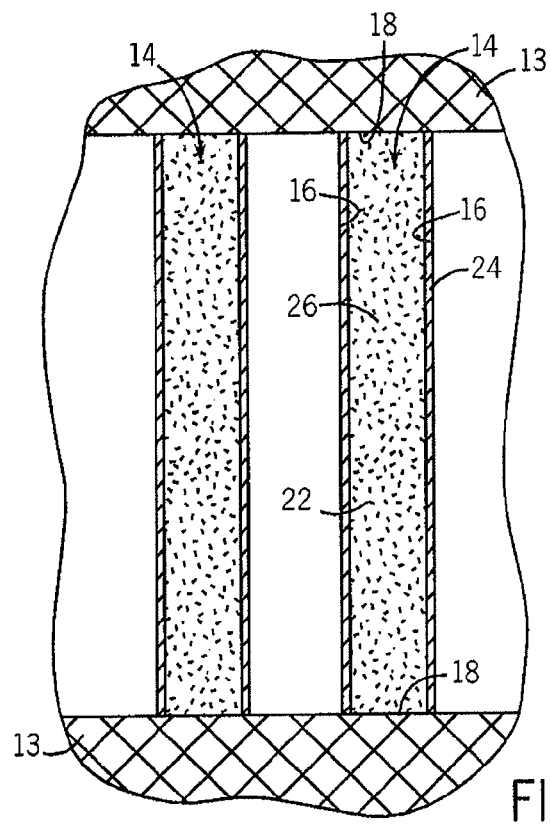
FIGS. 9A and 9B (taken along lines 9A/9B-9A/9B of FIG. 9) are diagrammatic top plan views of the substrates shown, respectively, in FIG. 5 and FIG. 1 at a subsequent processing step, according to different embodiments of the disclosure.

In other embodiments, the surface of both the trench floor 20 and the trench ends 18 can be treated to be hydrophilic such that aqueous phase of the emulsion wets both the trench floor 20 and ends 18, and the surfactant layer (e.g., surfactant monolayer 24 (FIGS. 9-11A)) forms solely along the hydrophobic trench sidewalls 16, as in FIGS. 9 and 9A. In some embodiments, the material layer 12 can be structured to provide a silicon surface exposed at the sidewalls 16 that is treated to remove native oxide to form H-terminated silicon and to provide an oxide surface exposed at the ends (edges) 18 (and floor 20) of the trenches 14 that is treated with a PEG ligand.

Figure 2:
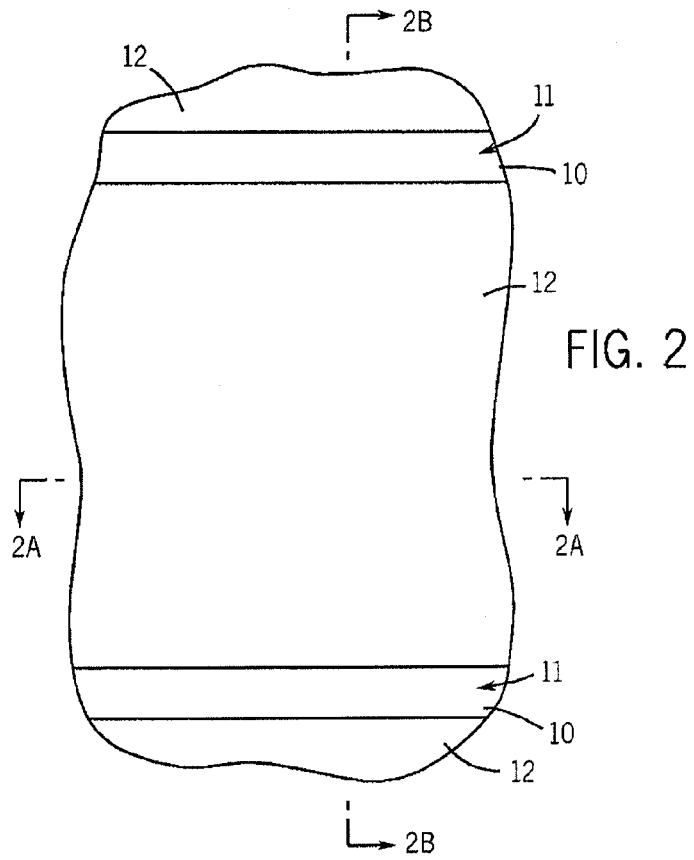
Figure 2A:
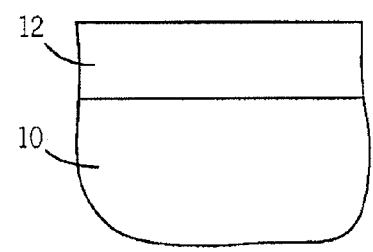
Figure 2B:
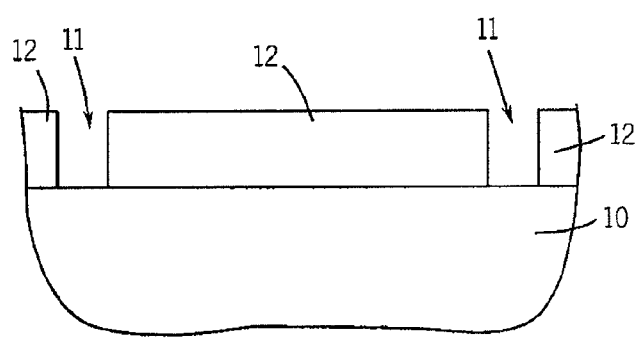
Figure 3:
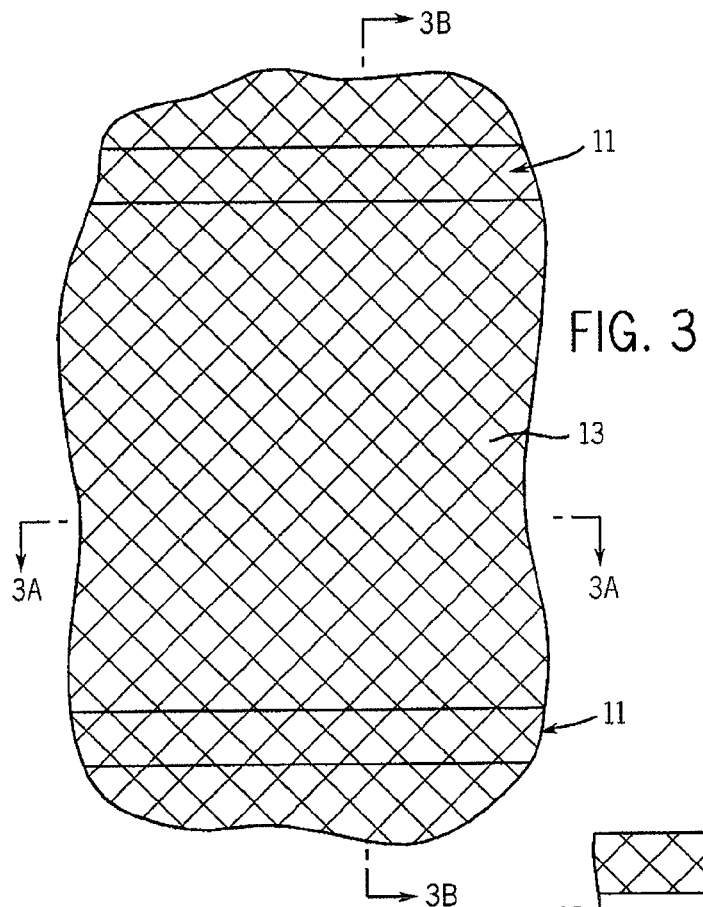
Figure 3A:
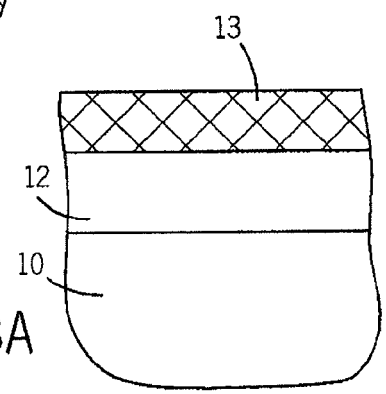
Figure 3B:
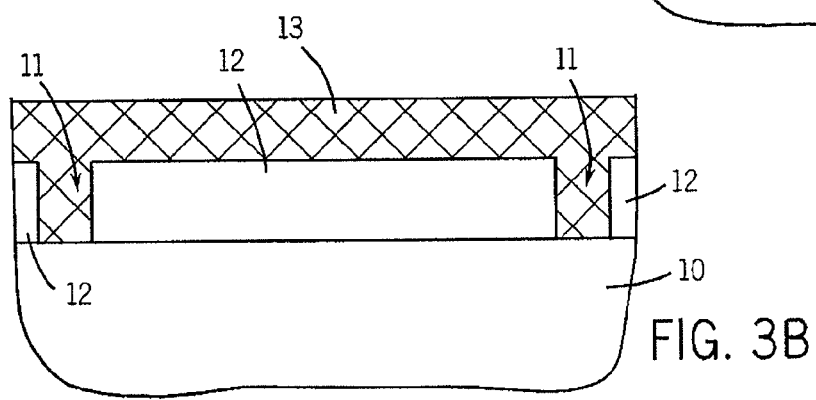

For example, referring to FIGS. 2-2B, a material layer 12 of silicon can be deposited and etched lithographically to form trenches 11 that expose an underlying $SiO_x$ layer of the substrate 10. Then, as illustrated in FIGS. 3-3B, a $SiO_x$ layer 13 can be deposited to overfill the trenches 11 and removed, for example by chemical-mechanical planarization (CMP), to expose the surface of the silicon material layer 12 and $SiO_x$ layer 13 within the trenches 11, as shown in FIGS. 4-4B. As depicted in FIGS. 5-5B, the silicon material layer 12 can then be etched lithographically using a photoresist mask to define the trenches 14 with the $SiO_x$ layer of the substrate 10 exposed as the trench floor 20, the $SiO_x$ layer 13 as the trench ends 18, and the silicon material layer 12 exposed as the sidewalls 16.

Figure 8:
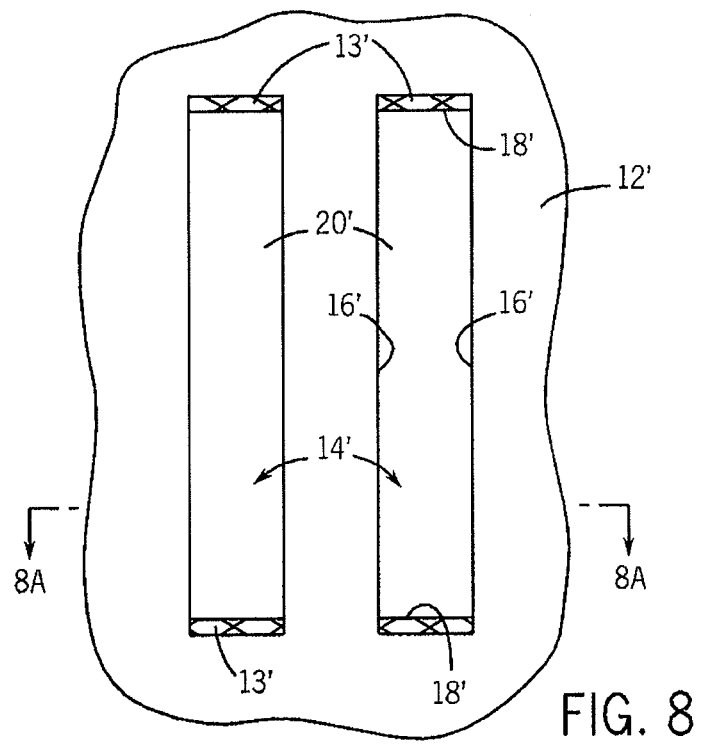
Figure 8A:
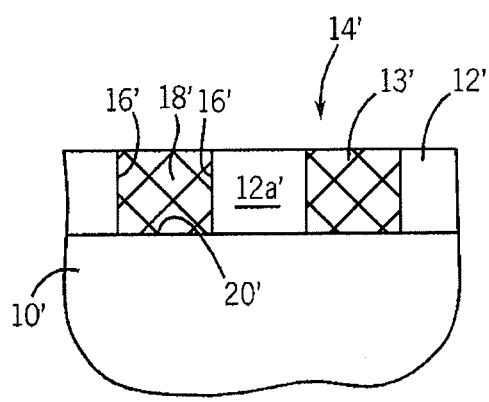

In another embodiment, a silicon layer 12' can be deposited and etched lithographically to form trenches 14' that expose an underlying $SiO_x$ layer 10' (as trenches 14 expose the substrate 10 in FIGS. 1 and 1A). Then, as illustrated in FIG. 6, a $SiO_x$ layer 13' can be deposited to overfill the trenches 14' and removed, for example, by chemical-mechanical planarization (CMP), to expose the surface of the silicon layer 12'/12a' and $SiO_x$ layer 13' within the trenches 14', as shown in FIGS. 7 and 7A. As depicted in FIGS. 8 and 8A, portions of the $SiO_x$ layer 13' can then be etched lithographically using a photoresist mask to redefine the trenches 14' with the $SiO_x$ layer 10' exposed as the trench floor 20', the $SiO_x$ layer 13' as the trench ends 18', and the silicon layer 12' exposed as the sidewalls 16'.

In either of the embodiments depicted in FIGS. 5-5B or FIGS. 8 and 8A, an aqueous fluoride treatment can be briefly conducted to remove native oxide on the material layer 12 (FIGS. 5-5B) or silicon layer 12' (FIGS. 8 and 8A) (to form H-terminated silicon sidewalls 16, 16') while minimizing etching of the $SiO_x$ layers (i.e., $SiO_x$ layer of substrate 10, $SiO_x$ layer 10', and $SiO_x$ layer 13, 13'). A PEG coupling agent can then be applied and bound to hydroxyl (—OH) groups on the $SiO_x$ floor 20, 20' and ends 18, 18' of the trenches 14, 14' in an inert atmosphere (e.g., nitrogen, argon, etc.) to minimize the reformation of native oxide on the silicon sidewalls 16, 16'.

Referring now to FIG. 9, an aqueous emulsion layer 22 composed of an amphiphilic agent (e.g., surfactant) and a water-soluble, hydrogel-forming polymer, with optional additives, is applied to fill the trenches 14 and over the material layer 12 (and $SiO_x$ layer 13). The polymer/surfactant emulsion (of the aqueous emulsion layer 22) can be applied, for example, by casting, dip coating, spray coating, knife-edge coating, spin casting (spin-coating), and the like, such that the aqueous emulsion layer 22 is maintained in a liquid consistency to allow the hydrogel to set up and the surfactant monolayer 24 to form at the trench sidewalls 16. Application of the emulsion can be conducted at about room temperature (e.g., about 20-25° C.) to up to about 95° C.

Upon application of the emulsion, the surfactant component will self-assemble to form a surfactant monolayer 24 (SAM) along the hydrophobic trench surfaces, with a thickness of about 10 nm or less, typically about 3-10 nm, or about 3 nm. The establishment of the surfactant monolayer 24 at the hydrophobic trench sidewalls 16 is dependent, at least in part, on the presence of water. An aqueous phase 26 of the emulsion comprising the polymer component orients to the hydrophilic floors 20 at the center of the trenches 14. The rate of self-assembly of the surfactant monolayer 24 (SAM) is relatively rapid at about 0.1-1 minute (or less), and is generally limited by the rate of diffusion of the surfactant to the hydrophobic surfaces (e.g., sidewalls 16).

Figure 9B:
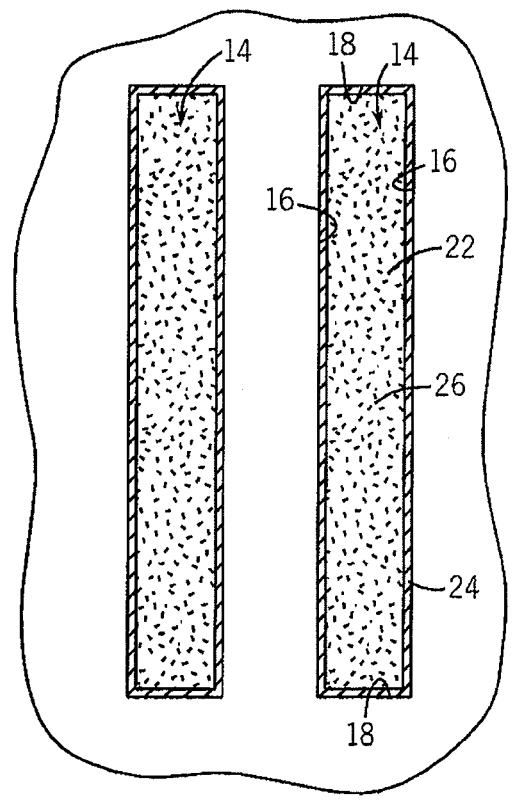

As illustrated in FIG. 9A, in embodiments in which the sidewalls 16 are hydrophobic (e.g., H-terminated silicon) and the trench floor 20 and ends 18 are hydrophilic, the formation of the surfactant monolayer 24 will occur solely along the trench sidewalls 16 with the polymer aqueous phase 26 of the emulsion wetting the trench floor 20 and ends 18. In other embodiments in which both the trench sidewalls 16 and ends 18 are hydrophobic, the surfactant component of the emulsion will form a surfactant monolayer 24 on both the trench ends 18 and sidewalls 16, as shown in FIG. 9B.

Suitable water-soluble and hydrogel-forming polymers include, for example, poly(ethylene oxide) (PEO) and poly(ethylene glycol) (PEG). An example of a PEG-based hydrogel material is described in Michael Malkoch et al., *Synthesis of Well-Defined Hydrogel Networks Using Click Chemistry*, CHEM. COMMC'NS 2774-76 (2006), the disclosure of which is incorporated by reference herein. Briefly, a PEG-based hydrogel material can be prepared using Click chemistry, e.g., a copper-catalyzed cycloaddition with azide/acetylene coupling reactions, by reacting diacetylene-functionalized and tetraazide-functionalized PEG derivatives at room temperature under aqueous conditions in the presence of copper sulfate ($CuSO_4$) and sodium ascorbate as a reducing agent; wherein a hydrogel can form in less than about 30 minutes at about room temperature.

In other embodiments, the hydrogel can be synthesized by the photopolymerization of water-soluble vinyl monomers using visible or UV irradiation to form water-soluble polymers with two or more reactive groups, as described, for example, by Kytai Truong Nguyen & Jennifer L. West, *Photopolymerizable Hydrogels for Tissue Engineering Applications*, 23 (22) BIOMATERIALS 4307-14 (2002), the disclosure of which is incorporated by reference herein. Examples of photopolymerizable macromers include the following: PEG acrylate derivatives (e.g., Amarpreet S. Sawhney et al., *Bioerodible Hydrogels Based on Photopolymerized Poly(ethylene glycol)-co-poly(α-hydroxy acid) Diacrylate Macromers*, 26 (4) MACROMOLECULES 581-87 (1993)); PEG methacrylate derivatives (e.g., J. Elisseeff et al., *Photoencapsulation of Chondrocytes in Poly(ethylene oxide)-Based Semi-interpenetrating Networks*, 51 (2) J. BIOMEDICAL MATERIALS RESEARCH 164-71 (2000); I.S. Kim et al., *Self-Assembled Hydrogel Nanoparticles Composed of Dextran and Poly(ethylene glycol) Macromer*, 205 (1-2) INT'L J. PHARM. 109-16 (2000)); polyvinyl alcohol (PVA) derivatives (e.g., U.S. Pat. No. 5,849,810 (Müller) (entitled *Photocrosslinked Polymers*); P. Martens and K. S. Anseth, *Characterization of Hydrogels Formed from Acrylate Modified Poly(vinyl alcohol) Macromers*, 41 (21) POLYMER 7715-22 (2000)); and modified polysaccharides, such as hyaluronic acid derivatives (e.g., T. Matsuda et al., *Photoinduced Prevention of Tissue Adhesion*, 38 (3) ASAIO J. M154-57 (1992); Paul Bulpitt & Daniel Aeschlimarm, *New Strategy for Chemical Modification of Hyaluronic Acid: Preparation of Functionalized Derivatives and Their Use in the Formation of Novel Biocompatible Hydrogels*, 47 (2) J. BIOMEDICAL MATERIALS REsEARCH 152-69 (hyaluronic acid-based hydrogels)); and dextran methacrylate (e.g., S.H. Kim & C.C. Chu, *Synthesis and Characterization of Dextran-methacrylate Hydrogels and Structural Study by SEM*, 49 (4) J. BIOMEDICAL MATERIALS RESEARCH 517-27 (2000), and S.H. Kim & C.C. Chu, *In Vitro Release Behavior of Dextran-methacrylate Hydrogels Using Doxorubicin and Other Model Compounds*, 15 (1) J. BIOMATERIALS APPLICATIONS 23-46 (2000) (dextran-methacrylate hydrogel)); the disclosures of each of which are incorporated by reference herein.

In other embodiments, the hydrogel can be synthesized by the free radical-induced crosslinking of PEG-diacrylates or PVA-diacrylates, as described, for example, by P. Martens and K. S. Anseth, *Characterization of Hydrogels Formed from Acrylate Modified Poly(vinyl alcohol) Macromers*, 41 (21) POLYMER 7715-22 (2000) (acrylate-modified poly(vinyl alcohol) hydrogels); Sheng Lin-Gibson et al., *Structure-Property Relationships of Photopolymerizable Poly(ethylene glycol) Dimethacrylate Hydrogels*, 38 MACROMOLECULES 2897-902 (2005) (photopolymerizable PEG dimethacrylate hydrogels); Kai Guo & C. C. Chu, *Synthesis and Characterization of Novel Biodegradable Unsaturated Poly(ester amide)/Poly(ethylene glycol) Diacrylate Hydrogels*, 43 (17) J. POLYMER SCI. PART A: POLYMER CHEMISTRY 3932-44 (2005) (biodegradable unsaturated poly(ester-amide)s/PEG diacrylate hydrogels); and Chakravarthy S. Gudipati et al., *Hyperbranched Fluoropolymer and Linear Poly(ethylene glycol) Based Amphiphilic Crosslinked Networks as Efficient Antifouling Coatings: An insight into the Surface Compositions, Topographies, and Morphologies*, 42 (24) J. POLYMER SCI. PART A: POLYMER CHEMISTRY 6193-208 (2004) (hyperbranched fluoropolymer and linear PEG-based amphiphilic crosslinked networks), the disclosures of each of which are incorporated by reference herein.

In yet other embodiments, the hydrogel can be synthesized by crosslinking cysteine-based peptides with vinyl sulfone-functionalized multi-armed PEG macromers, as described, for example, by M.P. Lutolf et al., *Cell-Responsive Synthetic Hydrogels*, 15 (11) ADVANCED MATERIALS 888-92 (2003) (cell-responsive synthetic hydrogels), the disclosure of which is incorporated by reference herein. In other embodiments, the hydrogel can be synthesized from PEG macromers and dendritic peptide crosslinkers, as described, for example, by Michel Wathier et al., *Dendritic Macromers as In Situ Polymerizing Biomaterials for Security Cataract Incisions*, 126 (40) J. AM. CHEM. SOC'Y 12744-45 (2004) (peptide dendron with terminal cysteine residues mixed with PEG dialdehyde), the disclosure of which is incorporated by reference herein.

The polymer is combined with an amphiphilic surfactant (exhibits both hydrophilic and lipophilic (hydrophobic) characteristics) that will form a self-assembled monolayer (SAM) on the hydrophobic surfaces of the trench. Suitable amphiphilic surfactants include, for example, phospholipids (anionic surfactants), such as phosphatidylcholines (PCs), phosphatidylserines (PSs), phosphatidylethanolamines, phosphatidylinositols, phosphatidylglycerols, phosphatidic acids, lysophospholipids, among others. Examples of suitable phosphatidylcholines (PCs) include dipalmitoyl-PC (DPPC), 1-palmitoyl-2-oleoyl-PC (POPC), dioleoyl-PC (DOPC), and dilinoleoyl-PC (DLiPC), among others. Other useful surfactants include nonionic surfactants, such as octylphenol ethoxylates, for example, TRITON™-X Series surfactants, such as TRITON™ X-100 ($C_{14}H_{22}O$ $(C_2H_4O)_n$ where n=9 to 10)), among others.

The surfactant is included in the emulsion at a concentration effective to form a surfactant monolayer 24 having a thickness of about 10 nm or less or about 3-10 nm. A suitable emulsion can be formulated with an about 5-15% w/w of the polymer and an about 0.5-5% w/w of the surfactant, based on the total weight of the emulsion.

Optionally, the emulsion can include a crosslinking adjuvant or catalyst/cocatalyst. For example, in the use of Click chemistry to synthesize a PEG-based hydrogel material, the emulsion can include copper sulfate (e.g., at about 1% w/w) and sodium ascorbate, whereby the emulsion would be directly or about immediately dispensed. In the use of free radical cross-linking chemistry to synthesize the hydrogel material, an appropriate peroxide or photoinitiator can be included, and the emulsion layer can be crosslinked by exposure to UV light, focused e-beam, heat, etc., as appropriate to crosslink the polymer to form a hydrogel.

As a further option, the emulsion can include a compatible organic solvent to modify the thickness of the surfactant layer over a range of about 3 nm to up to about 10 nm. Suitable solvents include, for example, $C_8$-$C_{24}$ alkanes (e.g., octane, nonane, decane, undecane, dodecane, etc.), cycloalkanes (e.g., cyclopentane, cyclohexane, etc.), and aromatic hydrocarbons (e.g., benzene, toluene, etc.).

In addition, the emulsion can optionally include one or more hardening agents to fill or strengthen the hydrogel. Suitable hardening agents include, for example, inorganic nanoparticles, such as silicon dioxide ($SiO_2$); metal oxides, such as zirconium oxide ($ZrO_2$), titanium dioxide ($TiO_2$), cerium dioxide ($CeO_2$), aluminum oxide, $Al_2O_3$), iron oxide, vanadia, and tin oxide; carbonates, such as calcium carbonate; and carbon black. Solvated metals that can be precipitated can also be used as hardening agents. For example, in the use of Click chemistry to synthesize the hydrogel, the inclusion of a copper catalyst at about 1% w/w that precipitates after formation of the hydrogel can provide strengthening of the gel. Other examples of solvated metals that can be used as hardening agents are described, for example, in Joseph Mindel and Cecil V. King, *A Study of Bredig Platinum Sols*, 65 (11) J. AM. CHEM. SOC'Y 2112-15 (1943) (using electrochemical reduction of metals under water to produce sols of Pb, Sn, Au, Pt, Bi, Sb, As, Tl, Ag, and Hg), the disclosure of which is incorporated by reference herein.

An embodiment of a suitable emulsion composition can be formulated with:
about 5-15% w/w water-soluble, hydrogel-forming polymer;
about 1-5% w/w amphiphilic surfactant;
about 0-5% w/w organic solvent;
about 0-20% w/w (or more) hardening agent;
about 0-5% w/w cross-linking adjuvants; and
about 94-55% w/w water.

Figure 12:
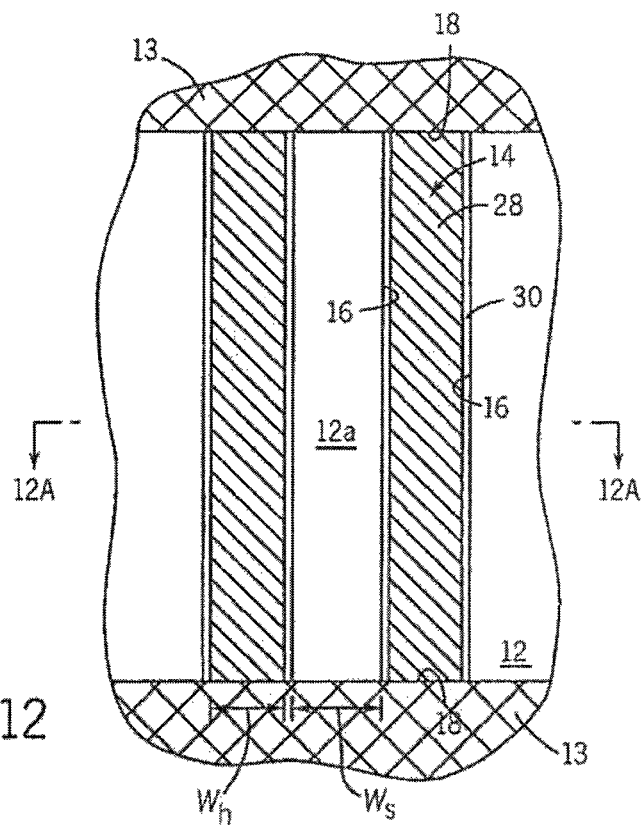
Figure 12A:
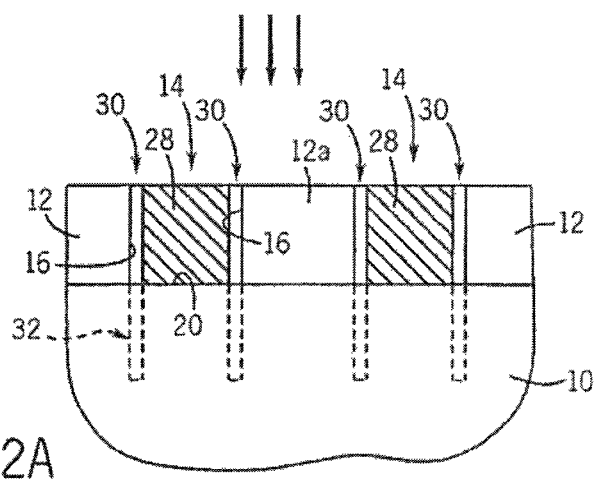

In some embodiments, after formation of the hydrogel with the aqueous phase 26 within the trenches 14, a liquid filler material can be applied to the surfactant monolayer 24 and hydrogel the aqueous phase 26 to reduce the impact of drying on the shape and adherence of the surfactant monolayer 24 to the hydrophobic trench surfaces and to further strengthen and reduce the porosity of the polymer hydrogel such that the shape of the hydrogel is retained after removal of the surfactant monolayer 24 and it functions as an adequate mask during a plasma etching process (see FIG. 12A, element 28 (a robust hydrogel 28)).

For example, in addition to the incorporation of inorganic nanoparticles as hardening agents, a silicon ester, such as tetraethoxysilane or tetraethyl orthosilicate (TEOS, $Si(OC_2H_5)_4$) (either neat or as solution in organic solvent or water), can be applied and allowed to diffuse into the hydrogel of the aqueous phase 26 to form a silicon oxide gel via conventional sol-gel reaction to fill in the shape of the hydrogel with an inelastic material. The diffusion process can be expedited by formulating an aqueous solution having either an acidic or basic pH. In embodiments in which the hydrogel includes an oxide hardening agent (e.g., $SiO_2$, $TiO_2$, etc.), the resulting sol (e.g., silica sol) acts to fuse or precipitate the separate particles of the hardening agent into a contiguous mass or suspension within the hydrogel to further harden the hydrogel, which can remain partially porous.

In other embodiments, the surfactant monolayer 24 can be formed as described in U.S. Pat. No. 6,884,842 (Soane et al.), the entire disclosure of which is incorporated by reference herein. Briefly, surfactant monomers containing olefinic group(s), with surface functional head groups that are complementary to a substrate surface, are applied to and self-assemble at a micelle-like interface on the substrate. The positions of the functional groups on the substrate are then stabilized by crosslinking reactive groups on the monomers by a free radical polymerization method to form a thin, insoluble polymer network or mat. The resulting surfactant monolayer 24 has high thermal and solvent stability, is robust against the removal of water, and is not disrupted by organic solvents such as alcohols that are released during formation of a sol. The monomers for forming the surfactant monolayer 24 are structured with a head group (e.g., alcohols, carboxylic acids, amides, amines, phosphates, sugars, disaccharides, etc.), a crosslinking group (e.g., a free radically polymerizable moiety, such as acrylates, methacrylates, acrylamides, vinyl ethers, epoxides, etc.), and a tail group fabricated and designed to have surfactant functionality. Examples of compounds include acryloylated sulfosuccinic acid ester surfactants, such as (bis(11-acryloylundecyl)sulfosuccinate), (bis-(3-acryloyl-2-ethylhexyl)sulfosuccinate), and (bis-2-acryloyldodecyl sulfosuccinate); and hydroxybenzoic acids, such as glycine-headed-tris(11-acryloyloxyundecyloxy)benzamide and ethanolamine-headed-tris(11-acryloyloxyundecyloxy) benzamide, which can be prepared as described in U.S. Pat. No. 6,884,842 (Soane et al.).

Self-assembly of the monomers to form the surfactant monolayer 24 proceeds by surface aggregation of the head groups at the water interface with the tail groups organized on hydrophobic surfaces, such as the hydrophobic trench sidewalls 16 defined in the material layer 12. Polymerization and crosslinking of the monomers can be accomplished by known reaction methods, including free-radical polymerization, which can include the application of radiation, such as UV light, to accelerate the process. Functional groups such as acrylates can be polymerized by heat or radiation such as UV light. In some embodiments, the polymerization of the crosslinking groups along the backbone after self assembly is conducted. Other crosslinking reactions known in the art, such as ring opening, condensation, group transfer, anionic and cationic polymerization, can optionally be used. Catalysts and/or photo- or thermal-initiators can optionally be used to promote crosslinking. Examples of crosslinking groups include acrylates, methacrylates, acrylamides, vinyl ethers, epoxides, methacrylamides, vinylbenzenes, α-methylvinylbenzenes, divinylbenzenes, vinyl ethers, maleic acid derivatives, fumaric acid derivatives, alkenes, dienes, alkynes, substituted dienes, thiols, alcohols, amines, carboxylic acids, carboxylic anhydrides, carboxylic acid halides, aldehydes, ketones, isocyanates, succinimides, carboxylic acid hydrazides, glycidyl ethers, silanes, siloxanes, chlorosilanes, alkoxysilanes, azides, 2'-pyridyldithiols, phenylglyoxals, iodos, maleimides, aryl halides, imidoesters, dibromopropionates, and iodacetyls. In addition to crosslinking, the surfactant layer can be formed by the condensation of polymeric surfactants by changing the solubility of the polymer or the polarity, pH, or temperature of the solvent.

Figure 10:
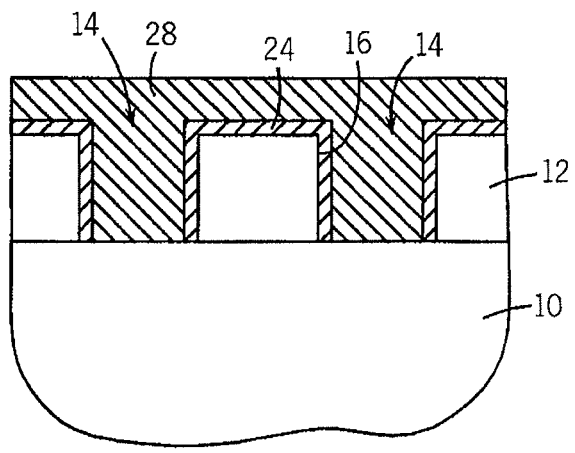
FIG. 10 illustrates an elevational, cross-sectional view of the substrate shown in FIG. 9A at a subsequent processing step.

Referring now to FIG. 10, the aqueous phase polymer component is then crosslinked to strengthen and form the robust hydrogel 28. In embodiments using cross-linkable surfactants, a polymer/surfactant emulsion containing such surfactants and the hydrogel-forming precursors (optionally with free radical initiators (either photo- or thermally-activated), hydrogel catalysts, hardening agents, etc.) would be coated onto the substrate 10, and the hydrogel and surfactant crosslinking can occur about simultaneously or sequentially.

In other embodiments, crosslinking can be achieved by applying a catalyst and/or co-catalyst onto the surface of the aqueous emulsion layer 22, for example, by spraying or applying drops of a catalyst/co-catalyst solution. For example, in the use of a PEG-based hydrogel material composed of a diacetylene-functionalized PEG derivative, a catalyst/co-catalyst solution of copper sulfate ($CuSO_4$) and sodium ascorbate can be applied at about room temperature or higher. Further hardening can be applied as needed to produce a structure such as the robust hydrogel 28 (FIG. 12A) that is a robust mask for later etching.

Figure 11:
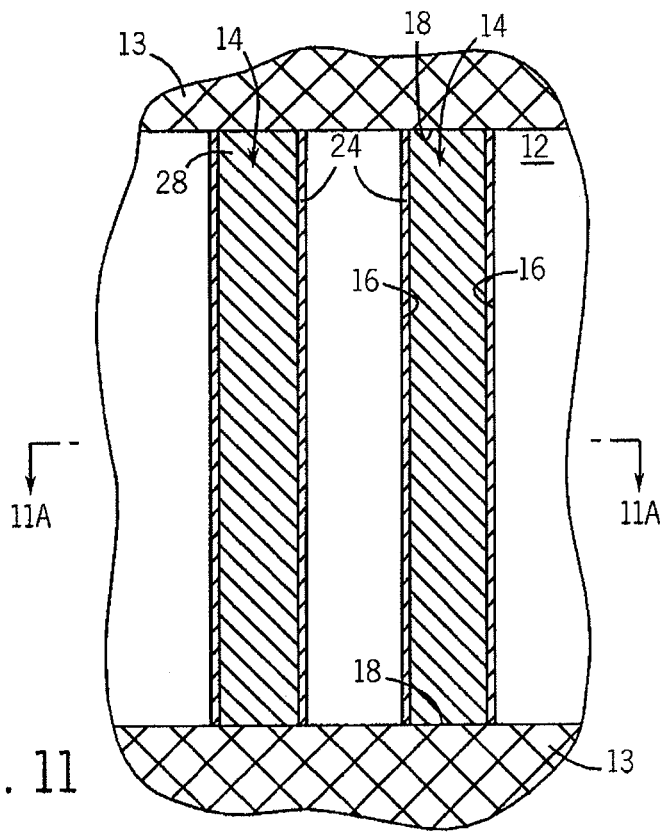
FIGS. 11 and 12 are diagrammatic top plan views of the substrate of FIG. 10 at subsequent processing stages.
Figure 11A:
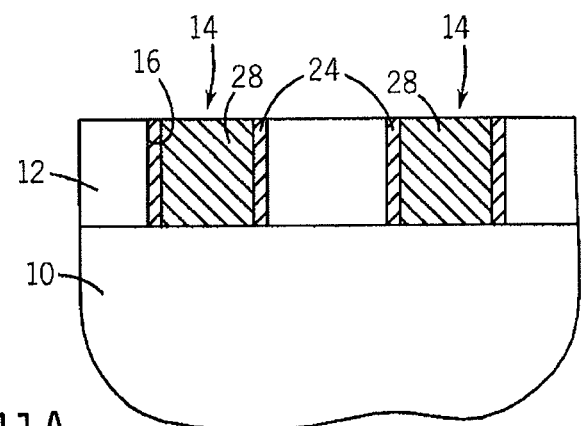
FIGS. 11A and 12A are elevational, cross-sectional views of the substrate shown in FIGS. 11 and 12 taken along lines 11A-11A and 12A-12A, respectively.

Excess material can then be removed, as shown in FIGS. 11 and 11A, to expose the surfactant monolayer 24 (SAM) along the trench sidewalls 16 (and ends 18, referring to the embodiment in FIG. 9B). Removal of the excess material can be conducted, for example, using a mechanical planarization apparatus, such as a grinder. Planarization can also be performed using a chemical-mechanical planarization (CMP) apparatus with an alkaline slurry containing abrasive particles, for example, an alkaline silica or ceria slurry with potassium hydroxide (KOH), sodium hydroxide (NaOH), tetramethyl ammonium hydroxide (TMAH; $(CH_3)_4NOH$), and the like. Removal of the material can also be performed using an etch back process, such as a wet etch process (e.g., using basic conditions to remove a PEG hydrogel), or a dry etch (e.g., plasma etch) process to etch the hydrogel (and optionally included hardening agent), for example, a combination of oxygen for the carbonaceous components and a fluorocarbon for silica hardening agents (e.g., $CH_2F_2$, $CHF_3$, $CF_4$, etc.). Optionally, the hydrogel can be dried prior to a planarization or etch process to reduce the thickness and facilitate the removal process, provided that the structure of the robust hydrogel 28 has enough structural integrity to not shift during the drying process.

Referring now to FIGS. 12 and 12A, the surfactant monolayer 24 (FIG. 11A) is then selectively removed leaving a void or channel 30 along the trench sidewalls 16 that is the width of the surfactant monolayer 24 (e.g., up to about 10 nm wide) and the crosslinked, robust hydrogel 28 intact within the center of the trenches 14. In embodiments in which the surfactant monolayer 24 is not crosslinked, selective removal of the surfactant monolayer 24 can be achieved, for example, by a wet etch process with an appropriate solvent (e.g., water, alcohols, aromatic hydrocarbons, such as toluene and xylene) or by dry etch. In other embodiments, a crosslinked surfactant monolayer 24 can be removed by a selective dry etch (e.g., plasma etch) process, for example, an oxygen plasma "ashing" process, or other appropriate technique.

The resulting structure is composed of a pair of channels (lines) 30 up to about 10 nm wide (e.g., about 3-10 nm wide) and registered to the trench sidewalls 16. Each pair of channels 30 within a trench 14 is separated from each other by the width ($w_h$) of the hydrogel (e.g., the robust hydrogel 28) within the trench14, and from a channel 30 in an adjacent trench 14 by the width ($w_s$) of the spacer 12*a* between the trenches 14. The hydrogel film (i.e., the robust hydrogel 28) can be then used, for example, as a lithographic template or mask to pattern (arrows ↓↓) the underlying substrate 10 in a semiconductor processing, for example, by a non-selective RIE etching process, to define a series of channel or grooves 32 (shown in phantom lines in FIG. 12A) in the sub-10 nanometer size range. The grooves 32 can then be filled, for example, with a conductive material (e.g., metal) to form nanowire channel arrays for transistor channels, semiconductor capacitors, and to form nanowire channel arrays for transistor gates and digit lines. The grooves 32 may be filled with a dielectric material to define source/drain active areas. Further processing can then be performed as desired.

Another method according to an embodiment of the invention, illustrated with reference to FIGS. 13-19, utilizes a graphoepitaxy technique that involves the use of a lithographical-defined (first) trench to direct a lamellar-phase block copolymer film to self assemble into a lamellar array of alternating perpendicular-oriented polymer-rich blocks that extend the length and are ordered and registered to the sidewalls of the (first) trench. Selective removal of one of the blocks forms a series of about 10-30 nanometer-scale parallel lines that can be used as a template or mask to etch about 10-30 nm grooves (second trenches) into the underlying substrate within the wider first trench. The above-described polymer/surfactant emulsion can then be formed within the second trenches and processed to form the hydrogel mask to etch a series of sub-10 nanometer-scale grooves in the underlying material layer.

To produce a polymer film within the first trench using a lamellar-phase block copolymer, the surfaces of the sidewalls and ends of the trench are preferential wetting by the one block of the copolymer and the trench floor is neutral wetting (equal affinity for both blocks of the copolymer) to allow both blocks of the copolymer material to wet the floor of the trench. Entropic forces drive the wetting of a neutral wetting surface by both blocks, resulting in the formation of a single layer of lamellae across the width of the trench.

In some embodiments, the second trenches are structured with hydrophilic floors and ends, such that the aqueous phase of the emulsion wets both of those surfaces, and hydrophobic sidewalls, such that the surfactant layer forms solely along that surface (as in FIG. 9).

Figure 13:
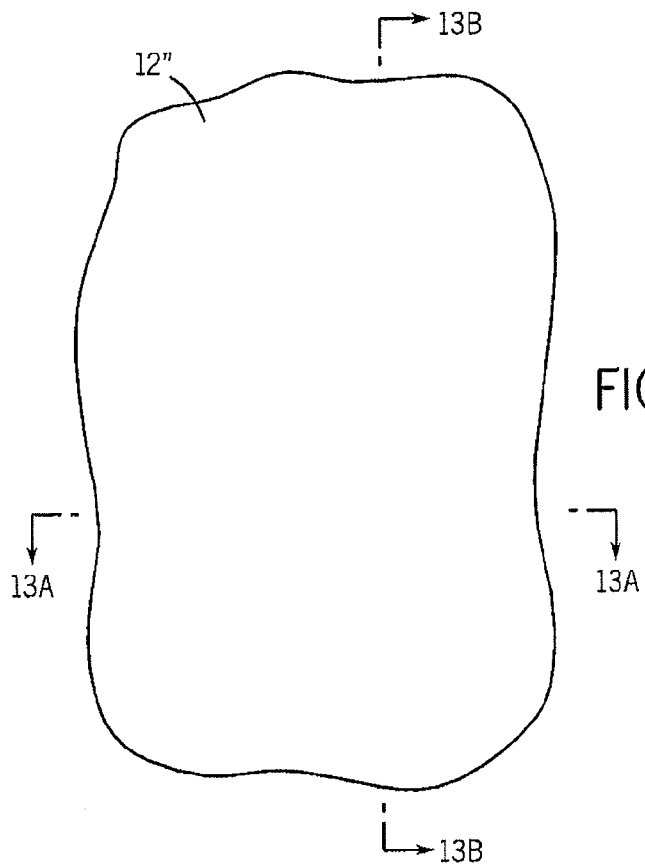
FIG. 13 illustrates a diagrammatic top plan view of a portion of a substrate at a preliminary processing stage according to another embodiment of the present disclosure.
Figure 13A:
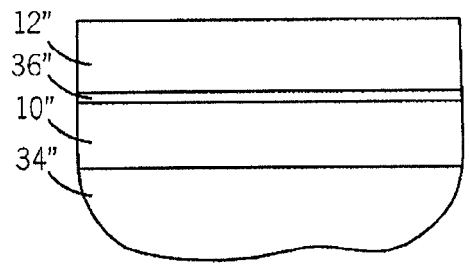
FIGS. 13A and 13B are elevational, cross-sectional views of the substrate depicted in FIG. 13 taken along lines 13A-13A and 13B-13B, respectively.
Figure 13B:
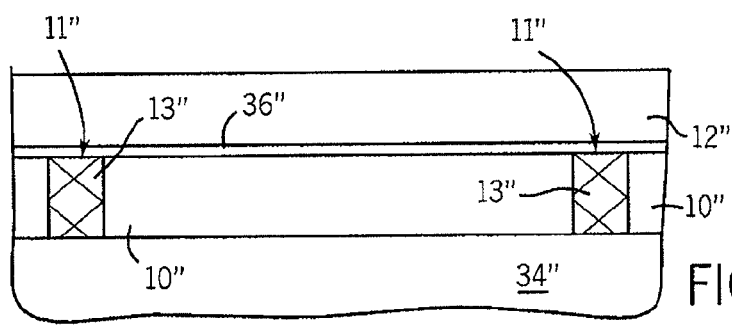

For example, in an embodiment shown in FIGS. 13-13B, a substrate 10" is provided bearing a neutral wetting layer 36" having a neutral wetting surface. The substrate 10" can comprise, for example, silicon or amorphous (transparent) carbon or a metal film (e.g., gold, aluminum, etc.). The substrate 10" overlies a sub-material layer 34", which, in some embodiments, comprises an oxide (e.g., silicon oxide, $SiO_x$), which is inherently hydrophilic.

As shown, a silicon layer in the substrate 10" has been etched lithographically to form trenches 11" to the underlying sub-$SiO_x$ layer (i.e., sub-material layer 34", and the trenches 11" filled with a $SiO_x$ layer 13", as described with reference to FIGS. 2-4B.

The neutral wetting surface 36" is formed on the substrate 10" prior to forming an overlying material layer 12". As illustrated in FIGS. 14-14B, etching through the material layer 12" to form a first trench 38" exposes the underlying neutral surface layer 36" as the floor or bottom surface 40" of the trench 38".

The neutral wetting surface can be provided, for example, by applying a neutral wetting polymer to form a neutral wetting layer 36" on the surface of the substrate 10". In the use of a self-assembling (SA) diblock copolymer composed of PS-b-PMMA, a random PS:PMMA copolymer brush layer (PS-r-PMMA)) that exhibits non-preferential or neutral wetting toward PS and PMMA can be applied by spin-coating onto the surface of substrate 10". The brush can be affixed by grafting (on an oxide substrate or native oxide layer) or by crosslinking (any surface) using UV radiation or thermal processing. For example, a random copolymer solution composed of PS and PMMA with hydroxyl end groups (e.g., about 58% PS) can be applied to the surface of the substrate 10" as a layer about 5-10 nm thick and end-grafted by heating at about 160° C. for about 48 hours.

A trench floor that is neutral wetting to PS-b-PMMA can also be prepared by spin coating a photo- or thermally-crosslinkable random copolymer, such as benzocyclobutene- or azidomethylstyrene-functionalized random copolymers of styrene and methyl methacrylate (e.g., poly(styrene-r-benzocyclobutene-r-methyl methacrylate) (P(S-r-BCB-r-MMA))), onto the surface of the substrate 10" and thermally crosslinking the polymer (e.g., at about 200° C. for about 4 hours) to form a cross-linked polymer mat as a neutral wetting layer 36".

Another neutral wetting surface for PS-b-PMMA can be provided by hydrogen-terminated silicon, which can be prepared by a conventional process, for example, by a fluoride ion etch of a silicon substrate 10" (with native oxide present, about 12-15 Å), for example, by immersion in aqueous solution of hydrogen fluoride (HF) and buffered HF or ammonium fluoride ($NH_4F$), by HF vapor treatment, by exposure to hot $H_2$ vapor, or by a hydrogen plasma treatment (e.g., atomic hydrogen).

Figure 14C:
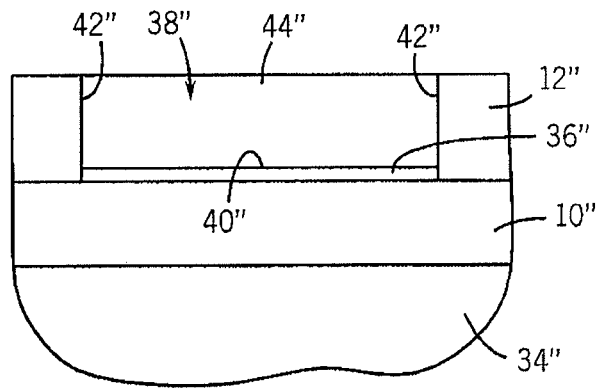
FIG. 14C is an elevational, cross-sectional view of the another embodiment of the substrate shown in FIG. 14, taken along lines 14C-14C.

In another embodiment shown in FIG. 14C, the material layer 12" can be formed on the substrate 10" and etched to form the first trench 38", and a neutral wetting material for the neutral wetting layer 36" then applied to the trench floor 40". For example, a cross-linkable random copolymer can be spin coated onto the surface of the substrate 10" within the first trench 38" and crosslinked to form a crosslinked polymer mat as the neutral wetting layer 36". Capillary forces pull the random copolymer to the bottom of the first trench 38". Non-crosslinked polymer material can be subsequently removed. A neutral-wetting polymer (NWP), such as random copolymer of P(S-r-MMA-r-HEMA), can also be grafted selectively to a material layer, e.g., an oxide floor. See, for example, Insik In et al., *Side-Chain-Grafted Random Copolymer Brushes as Neutral Surfaces for Controlling the Orientation of Block Copolymer Microdomains in Thin Films*, 22 LANGMUIR 7855-60 (2006), the disclosure of which is incorporated by reference herein. In other embodiments, an olefinic monomer, such as PMMA or PS, can be grafted onto an H-terminated silicon substrate 10" (i.e., floor 40") by an in situ free radical polymerization using a di-olefinic linker, such as divinyl benzene to produce an about 10-15 nm thick film.

As shown in FIGS. 14-14B, a material layer 12" is formed on the substrate 10" and patterned to form the first trench 38" structured with a floor or bottom surface 40", opposing sidewalls 42", opposing ends (edges) 44", a width (w), a length (l) and a depth (D). The first trench 38" can be formed by a lithographic technique, for example, photolithography, extreme ultraviolet (EUV) lithography, proximity X-rays, and electron beam (e-beam) lithography, as known and used in the art.

The trench sidewalls 42" and ends 44" are preferential wetting by one block of the copolymer to induce formation of lamellar polymer domains as the blocks self-assemble. The material layer 12" defining the trench surfaces (e.g., sidewalls 42" and ends 44") can be an inherently preferential wetting material, or in other embodiments, a layer of a preferential wetting material can be applied onto the surfaces of the first trench 38". For example, in the use of poly(styrene-block-methyl methacrylate) (PS-b-PMMA), the material layer 12" can be composed of an oxide (e.g., silicon oxide, $SiO_x$) or a clean silicon surface (with native silicon oxide), which exhibits preferential wetting toward the PMMA block to result in the assembly of a thin (e.g., ¼ pitch) interface layer of PMMA and alternating PMMA and PS lamellae (e.g., ½ pitch) within the trench in the use of a lamellar-phase block copolymer material. Other preferential wetting surfaces to PMMA can be provided, for example, by silicon nitride, silicon oxycarbide, polymethylmethacrylate (PMMA) polymer grafted to a sidewall material such as silicon oxide, and resist materials such as methacrylate-based resists. For example, a PMMA that is modified with a moiety containing one or more hydroxyl (—OH) groups (e.g., hydroxyethylmethacrylate) can be applied by spin-coating and then heated (e.g., to about 170° C.) to allow the OH groups to end-graft to the oxide sidewalls 42" and ends 44" of the first trench 38". Non-grafted material can be removed from the neutral wetting layer 36" by rinsing with an appropriate solvent (e.g., toluene). See, for example, P. Mansky et al., *Controlling Polymer-Surface Interactions with Random Copolymer Brushes*, 275 (5305) SCIENCE 1458-60 (1997), and Insik In et al., *Side-Chain-Grafted Random Copolymer Brushes as Neutral Surfaces for Controlling the Orientation of Block Copolymer Microdomains in Thin Films*, 22 LANGMUIR 7855-60 (2006), the disclosures of each of which are incorporated by reference herein.

The trench sidewalls 42", ends 44", and floor 40" influence the structuring of the array of lamellae within the first trench 38". The boundary conditions of the trench sidewalls 42" in both the x- and y-axis impose a structure such that the first trench 38" contains n number of lamellae. Factors in forming a single array or layer of lamellae within the first trench 38" include the width and depth of the first trench 38", the formulation of the block copolymer to achieve the desired pitch ($L_O$), and the thickness (t) (FIG. 15) of the copolymer film.

The first trench 38" is constructed with a width (w) such that a lamellar-forming block copolymer (or blend) will self assemble upon annealing into a single layer of "n" lamellae spanning the width (w) of the first trench 38", with each lamellar domain being separated by a value of $L_o$ (from center-to-center). The width (w) of the first trench 38" is a multiple of the inherent pitch value ($L_o$) of the block copolymer being equal to or about $nL_o$ ("$n*L_o$"), typically ranging from about n*10 to about n*100 nm (with n being the number of features or structures). In embodiments of the inventions, the depth (D) of the first trench 38" is greater than or at about $L_o$, as illustrated in FIG. 14A. The application and annealing of a block copolymer material having an inherent pitch value of $L_o$ in a first trench 38" having a width (w) at or about $L_o$ will result in the formation of a single layer of "n" lamellae spanning the width (w) and registered to the sidewalls 42" for the length of the first trench 38". In some embodiments, the dimensions of the first trench 38" are about 55-80 nm wide (w) and about 1600-2400 μm in length (l), with a depth (D) of about 50-500 nm.

Figure 15:
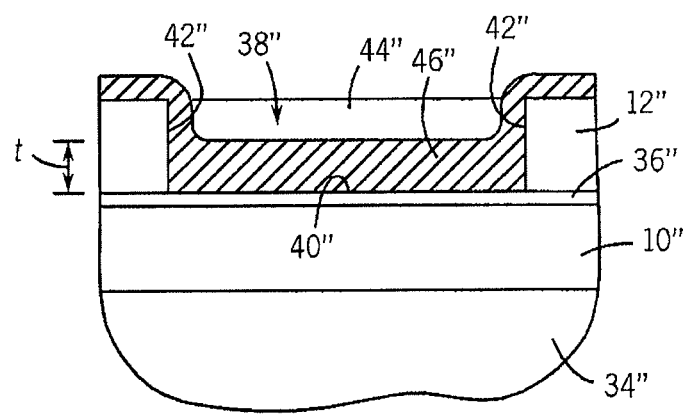
FIG. 15 illustrates an elevational, cross-sectional view of the substrate shown in FIG. 14A, at a subsequent processing step.

Referring now to FIG. 15, a layer 46" of a lamellar-phase self-assembling (SA) block copolymer material having an inherent pitch at or about $L_o$ (or a ternary blend of block copolymer and homopolymers blended to have a pitch at or about $L_o$) is then deposited, typically by spin casting (spin-coating), onto the floor 40" of the first trench 38". The block copolymer material can be deposited onto the patterned surface by spin casting from a dilute solution (e.g., about 0.25-2 wt % solution) of the copolymer in an organic solvent, such as dichloroethane ($CH_2Cl_2$) or toluene, for example.

The lamellar-phase block copolymer material is deposited into the first trench 38" to a thickness (t) less than the trench depth (D), for example, at about one-half of the trench depth (D), and at or about the $L_o$ value of the block copolymer material such that the copolymer film layer will self assemble upon annealing to form a single layer of lamellae across the width ($w_t$) of the first trench 38". A typical thickness (t) of the block copolymer film (i.e., layer 46") is about ±20% of the $L_o$ value of the polymer (e.g., about 10-100 nm) to form alternating polymer-rich lamellar blocks, each with a width of about $L_o$ (e.g., 25-35 nm) across the width (w) of the first trench 38". The thickness (t) of the layer 46" can be measured, for example, by ellipsometry techniques. As shown, a thin film of less than $L_o$ of the block copolymer material can be deposited onto the surface of the material layer 12"; this thin film will not self-assemble as it is not thick enough to form structures.

The volume fractions of the two blocks (AB) of the lamellar-forming diblock copolymer are generally at a ratio between about 50:50 and 60:40. An example of a lamellae-forming symmetric diblock copolymer is poly(styrene-block-methyl methacrylate) (PS-b-PMMA), with a weight ratio of about 50:50 (PS:PMMA) and total molecular weight ($M_n$) of about 51 kg/mol.

Although diblock copolymers are used in the illustrative embodiments, other types of block copolymers (i.e., triblock or multiblock copolymers) can be used. Examples of diblock copolymers include poly(styrene-block-methyl methacrylate) (PS-b-PMMA), polyethyleneoxide-polyisoprene, polyethyleneoxide-polybutadiene, polyethyleneoxide-polystyrene, polyethyleneoxide-polymethylmethacrylate, polystyrene-polyvinylpyridine, polystyrene-polyisoprene (PS-b-PI), polystyrene-polybutadiene, polybutadiene-polyvinylpyridine, and polyisoprene-polymethylmethacrylate, among others. Examples of triblock copolymers include poly (styrene-block methyl methacrylate-block-ethylene oxide). One of the polymer blocks of the block copolymer should be selectively and readily removable in order to fabricate an etch mask or template from the annealed film.

The block copolymer material can also be formulated as a binary or ternary blend comprising a SA block copolymer and one or more homopolymers of the same type of polymers as the polymer blocks in the block copolymer, to produce blends that swell the size of the polymer domains and increase the $L_o$ value of the polymer. The volume fraction of the homopolymers can range from 0% to about 40%. An example of a ternary diblock copolymer blend is a PS-b-PMMA/PS/PMMA blend, for example, 46 K/21 K PS-b-PMMA containing 40% 20 K polystyrene and 20 K poly(methylmethacrylate). The $L_o$ value of the polymer can also be modified by adjusting the molecular weight of the block copolymer, e.g., for lamellae, $L_o \sim (MW)^{2/3}$.

Figure 16:
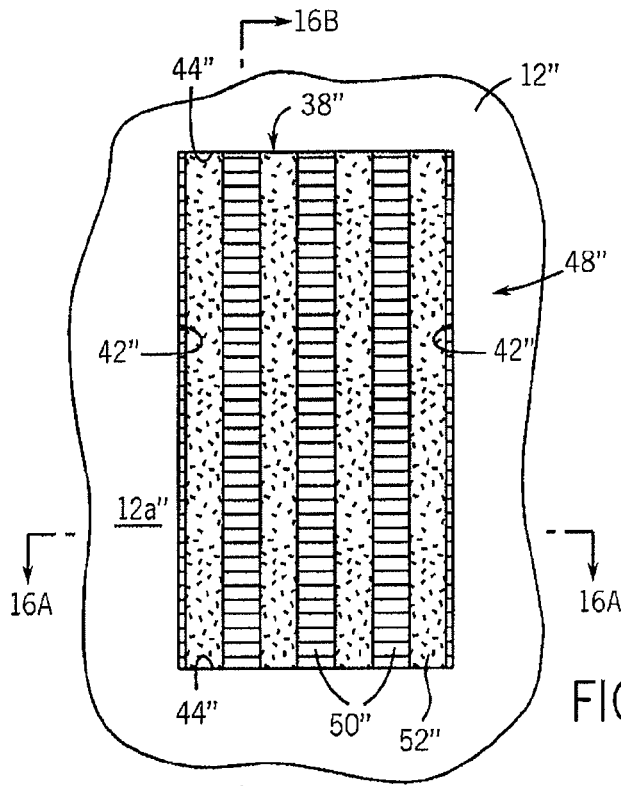
FIGS. 16 and 17 illustrate a diagrammatic top plan view of the substrate shown in FIG. 15 at a subsequent processing stages.
Figure 16A:
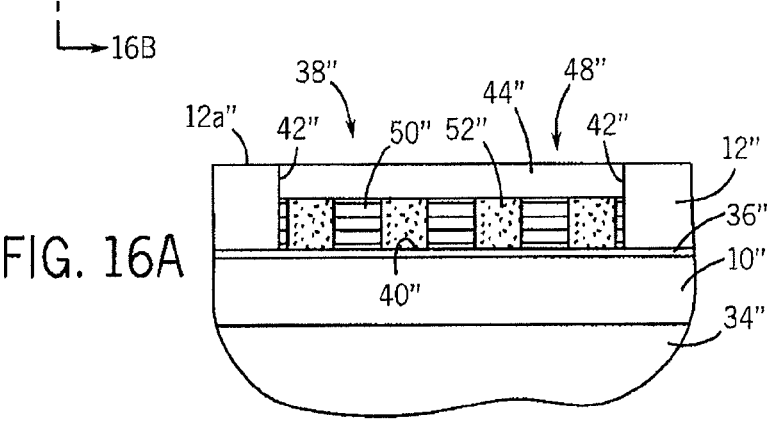
Figure 16B:
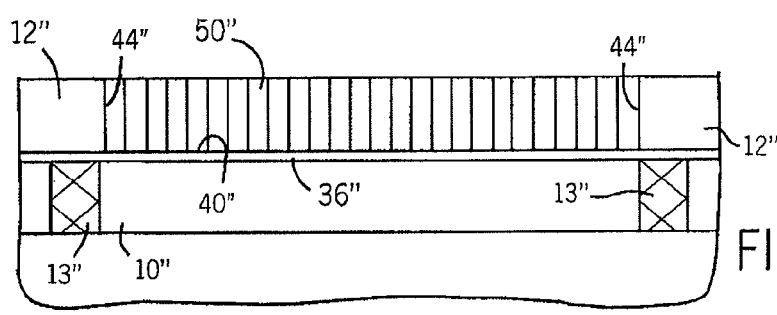

Referring now to FIGS. 16-16B, the block copolymer film (i.e., layer 46") is then annealed to form a self-assembled lamellar film 48", for example, by thermal annealing to above the glass transition temperature of the component blocks of the copolymer material to cause the polymer blocks to separate and self assemble into blocks 50", 52" according to the preferential and neutral wetting of the trench surfaces, i.e., floors 40", sidewalls 42", and ends 44". A PS-b-PMMA copolymer film can be annealed, for example, at about 180-195° C. in a vacuum oven for about 1-170 hours to produce a self-assembled film. The self-assembled lamellar film 48" can also be solvent annealed, for example, by slowly swelling both blocks 50", 52" of the self-assembled lamellar film 48" with a solvent, then slowly evaporating the solvent.

The constraints provided by the width (w) of the first trench 38" and the character of the block copolymer composition combined with preferential and neutral wetting surfaces within the first trench 38" results, upon annealing, in a single layer of n perpendicular-oriented, alternating lamellar polymer-rich blocks extending the length (l) and spanning the width (w) of the first trench 38" at an average pitch value of at or about $L_o$ (center-to-center). The number "n" or pitches of lamellar blocks within the first trench 38" is according to the width (w) of the first trench 38" and the molecular weight (MW) of the copolymer. For example, depositing and annealing an about 50:50 PS:PMMA block copolymer film ($M_n$=51 kg/mol; $L_o$=32 nm) in an about 250 nm wide first trench 38" will subdivide the first trench 38" into about eight (8) lamellar structures. The perpendicular orientation of lamellae can be examined, for example, using atomic force microscopy (AFM), transmission electron microscopy (TEM), or scanning electron microscopy (SEM).

The annealed and ordered film (i.e., the self-assembled lamellar film 48") can then be treated to crosslink the polymer segments to fix and enhance the strength of the self-assembled polymer blocks 50", 52" within the first trench 38" (e.g., to crosslink the PS segments). The polymers can be structured to inherently crosslink (e.g., upon UV exposure through a reticle), or one or both of the polymer blocks 50", 52" of the copolymer material can be formulated to contain a crosslinking agent. The substrate 10" can then be washed with an appropriate solvent, such as toluene, to remove the non-crosslinked portions of the self-assembled lamellar film 48" on surfaces outside the first trench 38" (e.g., on a crest 12a") leaving the registered, self-assembled lamellar film 48" within the first trench 38" (FIG. 16A).

Figure 17:
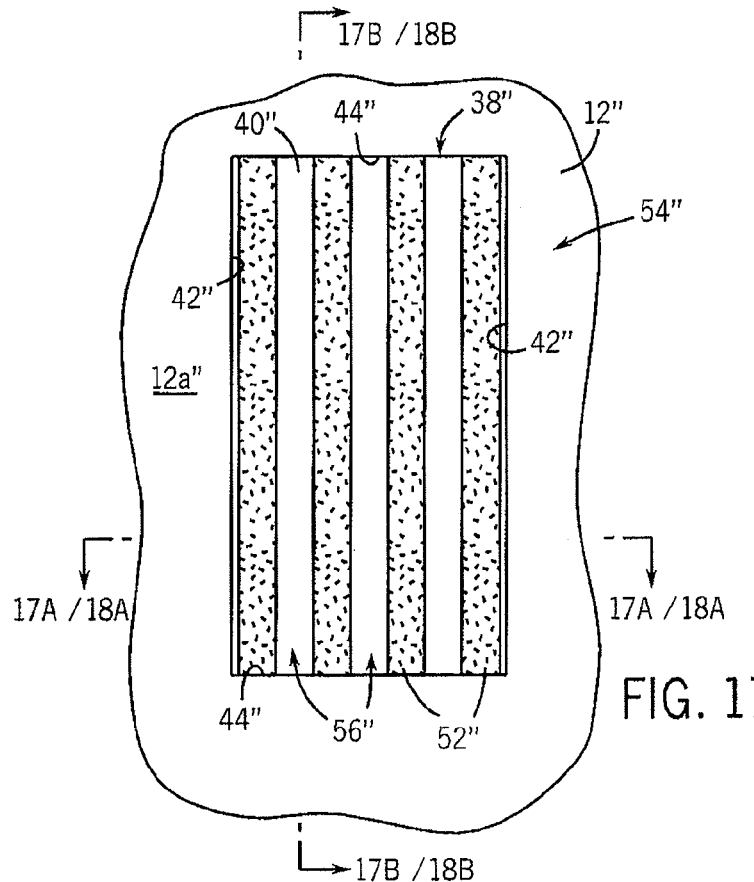
Figure 17A:
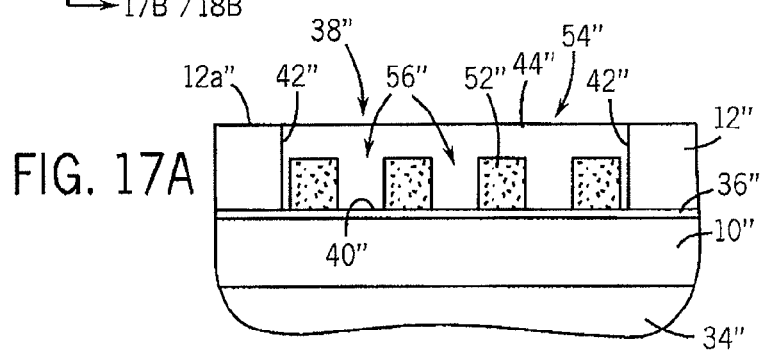
Figure 17B:
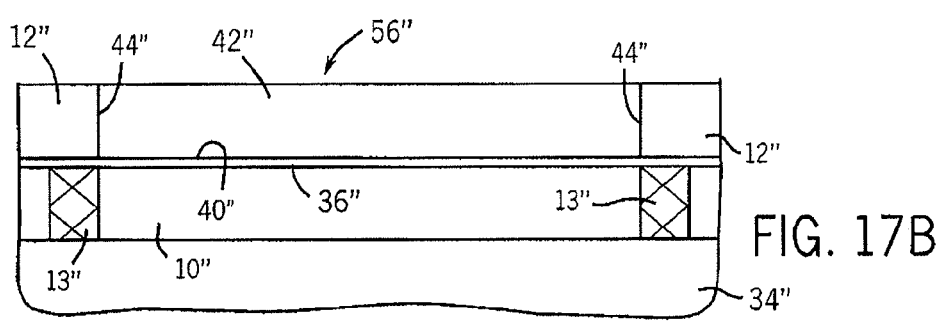

Referring now to FIGS. 17-17B, after the lamellar-phase block copolymer material is annealed and ordered to form the self-assembled lamellar film 48", one of the block components (e.g., block 50") can be selectively removed to produce a thin film 54" having registered and parallel oriented openings (slits) 56" that can be used, for example, as a lithographic template or mask to pattern the underlying substrate 10" within the first trench 38" in a semiconductor processing to define regular patterns in the nanometer size range (i.e., about 10-100 nm). For example, selective removal of one of the block components, block 50" (e.g., the PMMA domains) will result in openings (slits) 56" separated by another of the block components, block 52" (e.g., vertically oriented PS lamellar domains) with the trench floor 40" (e.g., neutral wetting layer 36" over substrate 10") exposed where the first blocks 50" (i.e., the PMMA blocks) were removed. Removal of the first blocks 50" (e.g., the PMMA phase domains) can be performed, for example, by application of an oxygen ($O_2$) plasma or $CF_4$ plasma (e.g., about 3:1 selective for PMMA), or by a chemical dissolution process such as acetic acid sonication by first irradiating the sample (ultraviolet (UV) radiation, 1 J/cm$^2$ 254 nm light), then ultrasonicating the self-assembled lamellar film 48" in glacial acetic acid, ultrasonicating in deionized water, and rinsing the self-assembled lamellar film 48" in deionized water to remove the degraded PMMA (i.e., the first blocks 50").

In some embodiments, the resulting thin film 54" will have a corrugated surface that defines a linear pattern of fine, nanometer-scale parallel openings (slits) 56" about 10-60 nm wide and extending the length of the first trench 38", the individual openings (slits) 56" separated by a polymer matrix of the second blocks 52" (e.g., of PS) about 10-60 nm wide. For example, removal of the PMMA domains (i.e., first blocks 50") (from PS-b-PMMA of MW 51 K) affords a PS (i.e., second block 52") mask of sub-lithographic dimensions, for example, a pitch of about 32 nm (16 nm PS domain). A smaller pitch can be dialed in by using lower molecular weight diblock copolymers.

Figure 18A:
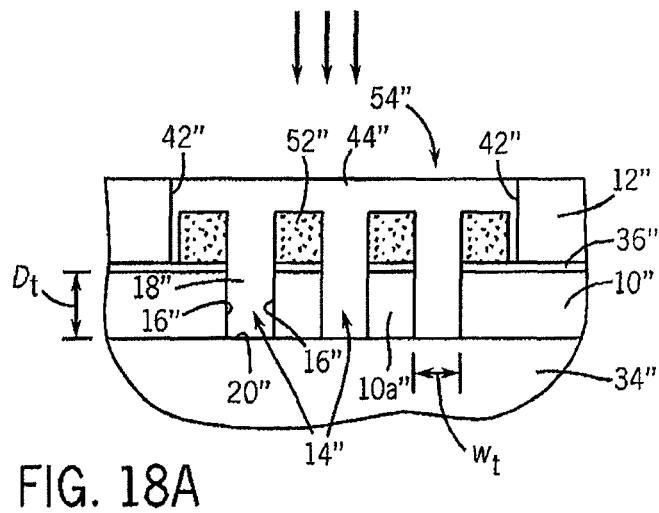
FIGS. 18A and 18B are elevational, cross-sectional views of the substrate shown in FIG. 17 taken, respectively, along lines 18A-18A and lines 18B-18B, at a subsequent processing stage.
Figure 18B:
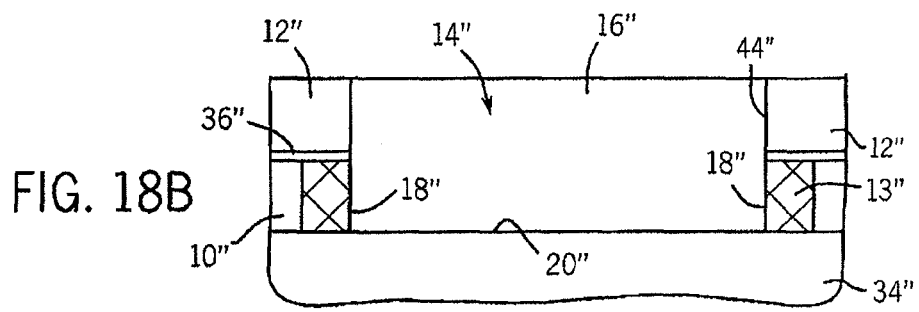
Figure 19:
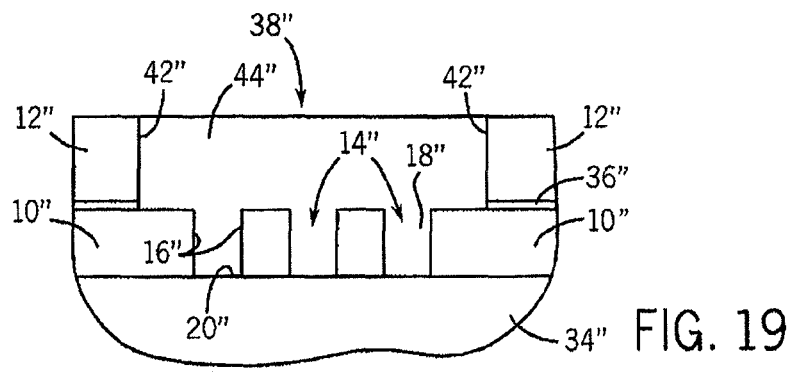
FIG. 19 is an elevational, cross-sectional view of the substrate shown in FIG. 18A at a subsequent processing stage.

The thin film 54" can then be used as a lithographic template or etch mask to pattern (arrows ↓↓) the underlying substrate 10" (e.g., silicon), for example, by a non-selective RIE etching process, to delineate a series of trenches (grooves, channels) 14" as illustrated in FIGS. 18A and 18B. The residual thin film 54" (e.g., polystyrene) can then be removed, for example, by an etch using a low density plasma of oxygen, resulting in the structure shown in FIG. 19.

Etching through the substrate 10" (e.g., silicon) to form the trenches 14" exposes the underlying sub-material layer 34", which is oxide in the illustrated example, as a floor or bottom surface 20" of the trenches 14", the oxide layer (i.e., $SiO_x$ layer 13") as ends 18", and substrate 10", which is silicon in the illustrated example, as sidewalls 16". In some embodiments, the dimensions of the trenches 14" are about 10-60 nm wide ($w_t$) and about 10-100 nm deep with a depth ($D_t$).

As previously described with reference to FIGS. 5-5B, an aqueous fluoride treatment can be briefly conducted to remove native oxide on the silicon layer of the substrate 10" (to form H-terminated silicon sidewalls 16") while minimizing etching of the $SiO_x$ layer 13" and sub-material layer 34". A PEG coupling agent can then be applied as previously described, for example, by grafting a ligand with a reactive end group such as a mono-hydroxylated PEG ligand to hydroxyl (—OH) groups on the $SiO_x$ floor 20" and ends 18" of the trenches 14" in an inert atmosphere (e.g., nitrogen, argon, etc.) to minimize the reformation of native oxide on the silicon sidewalls 16".

As described with reference to FIGS. 9-12A, the previously described aqueous polymer/surfactant emulsion can then be applied to fill the trenches 14" and processed to form an etch mask composed of the hydrogel material to etch the sub-material layer 34" to form grooves or channels (e.g., 32 shown in phantom lines in FIG. 12A).

Another method according to an embodiment of the invention is illustrated with reference to FIGS. 20-24. In some embodiments, a substrate 10''', such as the substrate 10 as described with respect to FIGS. 5-5B (or the substrate 10' as described with respect to FIGS. 8 and 8A) can be prepared having trenches 14''' with a hydrophilic floor 20''', hydrophilic ends 18''' (e.g., of $SiO_x$), and hydrophobic sidewalls 16''' (e.g., H-terminated silicon).

Figure 20:
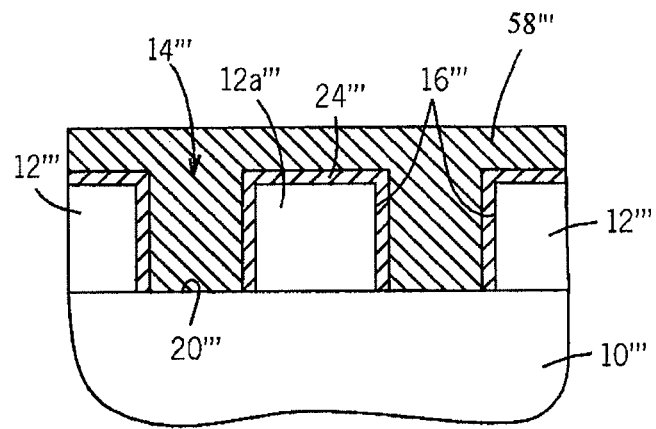
FIGS. 20 and 24 are elevational, cross-sectional views of the substrate shown in FIG. 5B at subsequent processing stages according to another embodiment of the present disclosure.

Referring now to FIG. 20, an aqueous emulsion (for an aqueous emulsion layer 58''') composed of a self-assembling amphiphilic agent, e.g., surfactant monomers, for example, as described above with reference to U.S. Pat. No. 6,884,842 (Sloane et al.), containing olefinic group(s) with surface functional head groups that are complementary to a substrate surface, can be applied to fill the trenches 14''' and over the material layer 12'''. The emulsion can be applied, for example, by casting, dip coating, spray coating, knife-edge coating, spin casting (spin-coating), and the like, such that the emulsion layer 58''' is maintained in a liquid consistency to allow a layer of the amphiphilic agent (e.g., surfactant) to form at the trench hydrophobic sidewalls 16'''. Application of the emulsion can be conducted at about room temperature (e.g., about 20-25° C.) to up to about 95° C. The amphiphilic agent (e.g., surfactant monomers) will self-assemble to form a surfactant monolayer 24''' on the hydrophobic sidewalls 16''' (e.g., H-terminated silicon) of the trenches 14'''. The monomers can then be polymerized and crosslinked, for example, by free-radical polymerization, to form a robust, thin, insoluble surfactant monolayer from the surfactant monolayer 24'''.

Figure 21:
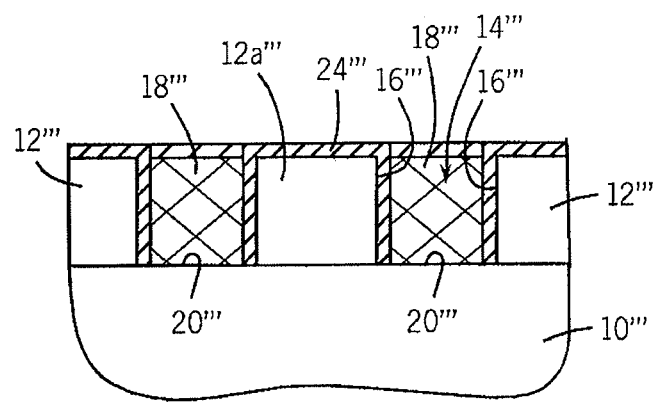

As shown in FIG. 21, the robust surfactant monolayer 24''' can then be dried, for example, by heating and/or blow-drying with a dry gas such as nitrogen, argon, and clean dry air, or by a Marangoni drying technique in which the structure is immersed in a DI water bath and drawn through a layer of a water-miscible solvent that is more volatile than water such as isopropyl alcohol (IPA), which rests on the surface of the DI water bath. Micellar structures or other material that has precipitated onto the trench hydrophilic floor 20''' and hydrophobic sidewalls 16''' during crosslinking of the surfactant monomers can be removed, for example, by rinsing or sonicating using a liquid that does not swell the crosslinked surfactant material or cause dewetting of the surfactant monolayer, for example, water, methanol, and isopropanol.

Figure 22:
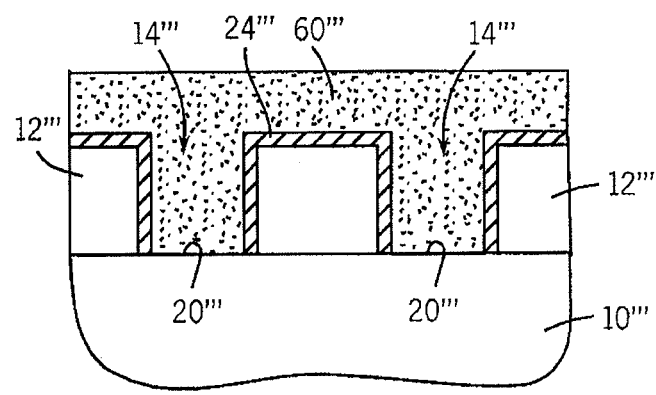
Figure 23:
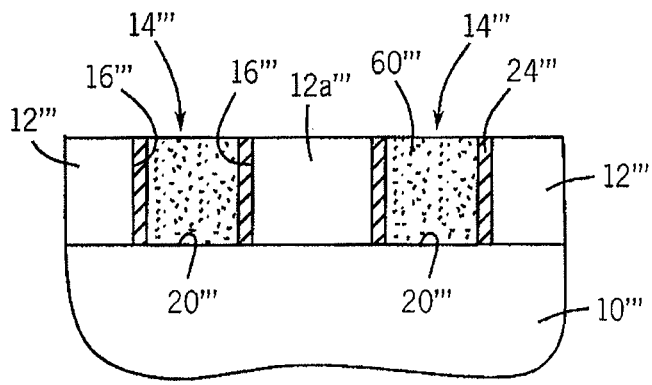

Referring now to FIG. 22, an inorganic material layer 60''' such as a dielectric material can then be deposited, for example, by a chemical deposition process at a low temperature such that the robust surfactant monolayer 24''' is not degraded (e.g., below about 150° C.), to fill the trenches 14'''. Suitable dielectric materials include, for example, silicon oxide ($SiO_x$), aluminum oxide ($Al_2O_3$), tantalum oxide ($TaO_x$), silicon carbide (SiC), hafnium oxide ($HfO_2$), hafnium aluminum oxide (HfAlO), silicon carbon nitride (SiCN), silicon nitride ($SiN_4$), yttrium oxide ($YO_2$), and tantalum pentoxide ($Ta_2O_5$). Excess material can then be removed as in FIG. 23, for example, by mechanical planarization, chemical-mechanical planarization, or an etch back process, to expose the robust surfactant monolayer 24''' along the trench hydrophobic sidewalls 16'''.

Figure 24:
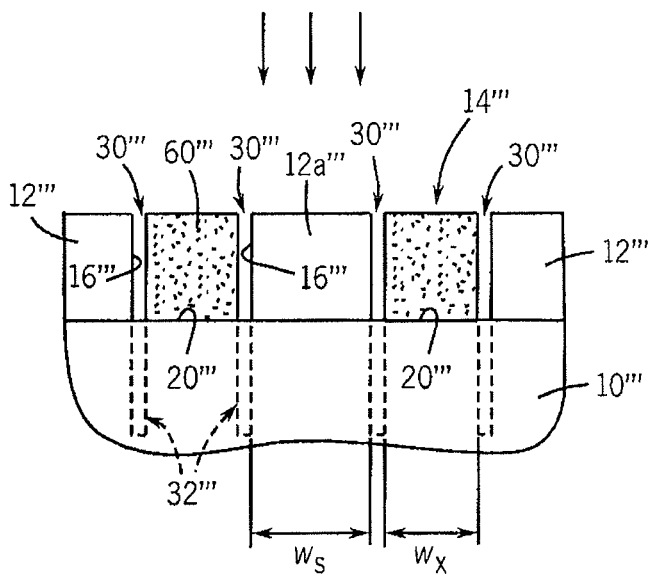

As depicted in FIG. 24, the surfactant monolayer 24''' along the trench hydrophobic sidewalls 16''' can then be selectively removed, leaving a channel or gap 30''' that is the width of the surfactant monolayer 24''' (e.g., up to about 10 nm wide), with the inorganic material layer 60''' remaining intact within the center of the trenches 14'''. Selective removal of the crosslinked (i.e., robust) surfactant monolayer 24''' can be achieved, for example, by a selective dry etch (e.g., plasma etch) process, for example, an oxygen plasma "ashing" process, or other appropriate technique.

The resulting structure is composed of a pair of channels (lines) or gaps 30''' up to about 10 nm wide (e.g., about 3-10 nm wide) and registered to the trench hydrophobic sidewalls 16'''. Each pair of channels or gaps 30''' within a trench 14''' is separated from each other by the width ($w_x$) of the inorganic material layer 60''' within the trench 14''', and from a channel or gap 30''' in an adjacent trench 14''' by the width ($w_s$) of the spacer 12a''' between the trenches 14'''. The inorganic material layer 60''' can be then used, for example, as a lithographic template or mask to pattern (arrows ↓↓) the underlying substrate 10''', for example, by a non-selective RIE etching process, to define a series of channels or grooves 32''' (shown in phantom lines in FIG. 24) in the sub-10 nanometer size range, which can be filled with metal or other conductive material, or dielectric material, for example.

The described films are useful as lithographic templates or etch masks for producing close-pitched, ordered, and registered, nanoscale channels and grooves that are sub-10 nm wide and several nanometers in length, for producing features such as floating gates for NAND flash with nanoscale dimensions. By comparison, photolithography techniques are unable to produce channels much below 60 nm wide without high expense. Resolution can exceed other techniques for forming channels and grooves, including self-assembling block copolymer processing and conventional photolithography. Fabrication costs utilizing methods of the disclosure are far less than electron beam (e-beam) or EUV photolithographies, which have comparable resolution.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A template for etching a substrate, comprising:
a cross-linked hydrogel within a trench in a material on the substrate, the cross-linked hydrogel formed from a water-soluble polymer and spaced from sidewalls of the trench by an elongate gap exposing the substrate at a floor of the trench.

2. The template of claim 1, wherein the elongate gap is up to about 10 nm wide.

3. The template of claim 1, wherein the elongate gap is about 3-10 nm wide.

4. The template of claim 1, wherein the cross-linked hydrogel is spaced from ends of the trench by another gap exposing the substrate at the floor of the trench.

5. The template of claim 1, wherein the floor of the trench comprises a hydrophilic material.

6. The template of claim 5, wherein the hydrophilic material comprises an oxide material.

7. The template of claim 1, wherein ends of the trench comprise a hydrophilic material.

8. The template of claim 1, wherein the sidewalls of the trench comprise a hydrophobic material.

9. The template of claim 8, wherein the hydrophobic material is selected from the group consisting of silicon and amorphous carbon.

10. The template of claim 8, wherein the hydrophobic material comprises transparent carbon.

11. The template of claim 1, wherein ends of the trench comprise a hydrophobic material.

12. The template of claim 11, wherein the hydrophobic material comprises hydrogen-terminated silicon.

13. The template of claim 1, wherein the floor of the trench comprises a hydrophilic polymer.

14. The template of claim 1, wherein the substrate comprises an oxide.

15. The template of claim 1, wherein the material comprises silicon or amorphous carbon.

16. The template of claim 1, wherein the water-soluble polymer is selected from the group consisting of poly(ethylene oxide), poly(ethylene glycol), poly(vinyl alcohol), and poly(saccharide).

17. The template of claim 1, wherein the cross-linked hydrogel comprises a hardening agent.

18. A template for etching a substrate, comprising:
a cross-linked hydrogel situated within a trench in a material on the substrate, the cross-linked hydrogel formed from a water-soluble polymer, the trench having hydrophobic sidewalls and a hydrophilic floor, the cross-linked hydrogel spaced from the hydrophobic sidewalls of the trench by an elongate gap exposing the substrate at the hydrophilic floor of the trench.

19. The template of claim 18, wherein ends of the trench comprise a hydrophilic surface.

20. The template of claim 18, wherein ends of the trench comprise a hydrophobic surface, the cross-linked hydrogel spaced from the ends of the trench by another gap exposing the substrate at the hydrophilic floor of the trench.

21. A template for etching an oxide substrate, comprising:
a cross-linked hydrogel within a trench in a silicon material on the oxide substrate, the cross-linked hydrogel formed from a water-soluble polymer, the trench having hydrophobic sidewalls and a hydrophilic floor, the cross-linked hydrogel spaced from the hydrophobic sidewalls of the trench by an elongate gap exposing the oxide substrate at the hydrophilic floor of the trench.

22. A template for etching a substrate, comprising:
a cross-linked hydrogel within a trench in a material on the substrate, the cross-linked hydrogel derived from a water-soluble polymer, the cross-linked hydrogel and sidewalls of the trench defining therebetween a pair of linear channels adjacent the sidewalls and extending a length of the trench, the substrate at a floor of the trench exposed in the pair of linear channels, each of the linear channels of the pair of linear channels being up to about 10 nm wide.

23. A template for etching a substrate, comprising:
a first trench in a material overlying a substrate; and
a plurality of polymer lines, the polymer lines separated from one another by openings distributed across a width of the first trench and extending a length of the first trench, the openings exposing second trenches in the substrate.

24. A template for etching a substrate, comprising:
an inorganic material within a trench in another material on a substrate, the inorganic material spaced from at least one sidewall of the trench by an elongate gap having a width up to about 10 nm, the elongate gap exposing the substrate at a floor of the trench.

25. The template of claim 24, wherein the inorganic material is a dielectric material.

26. The template of claim 25, wherein the inorganic material is selected from the group consisting of silicon oxide, aluminum oxide, tantalum oxide, silicon carbide, hafnium oxide, hafnium aluminum oxide, silicon carbon nitride, silicon nitride, yttrium oxide, and tantalum pentoxide.

* * * * *